(12) United States Patent
Eroz et al.

(10) Patent No.: US 6,370,669 B1
(45) Date of Patent: Apr. 9, 2002

(54) SETS OF RATE-COMPATIBLE UNIVERSAL TURBO CODES NEARLY OPTIMIZED OVER VARIOUS RATES AND INTERLEAVER SIZES

(75) Inventors: Mustafa Eroz, Germantown; A. Roger Hammons, Jr., North Potomac, both of MD (US)

(73) Assignee: Hughes Electronics Corporation, El Segundo, CA (US)

( * ) Notice: Subject to any disclaimer, the term of this patent is extended or adjusted under 35 U.S.C. 154(b) by 0 days.

(21) Appl. No.: 09/248,338

(22) Filed: Feb. 11, 1999

Related U.S. Application Data

(60) Provisional application No. 60/072,368, filed on Jan. 23, 1998, provisional application No. 60/074,932, filed on Feb. 17, 1998, provisional application No. 60/075,742, filed on Feb. 23, 1998, and provisional application No. 60/076,464, filed on Mar. 2, 1998.

(51) Int. Cl.[7] .......................... H03M 13/29; H03M 13/35
(52) U.S. Cl. ........................................ 714/774; 714/790
(58) Field of Search ................................ 714/751, 774, 714/790

(56) References Cited

U.S. PATENT DOCUMENTS

| | | | | |
|---|---|---|---|---|
| 5,983,384 A | * | 11/1999 | Ross ........................... | 714/755 |
| 6,088,387 A | * | 7/2000 | Gelblum et al. ............. | 375/222 |
| 6,094,427 A | * | 7/2000 | Yi ................................ | 370/331 |

FOREIGN PATENT DOCUMENTS

| | | |
|---|---|---|
| DE | 197 36 653 | 12/1998 |
| WO | WO 98 48517 | 10/1998 |

OTHER PUBLICATIONS

Acikel, O. F., et al. "High Rate Turbo Codes For BPSK/QPSK Channels", ICC '98 1998 IEEE International Conf. On Communications. Jun. 7–11, 1998, pp. 422–427 vol. 1.

Riedel, S., "Symbol–by–Symbol MAP Decoding Algorithm for High–Rate Convolutional Codes That Use Reciprocal Dual Codes", IEEE Journal on Selected Areas in Communications. vol. 16, No. 2, Feb. 1, 1998 pp. 175–185.

Barbulescu et al., "Rate Compatible Turbo Codes", Electronics Letters, vol. 31, No. 7, Mar. 30, 1995, pp. 535–536.*

Chan et al., "An Adaptive Hybrid FEC/ARQ Protocol Using Turbo Codes", 1997 IEEE 6th International Conference on Universal Personal Communications, Oct. 1997, pp. 541–545.*

Rowitch et al., "Rate Compatible Punctured Turbo (RCPT) Codes in a Hybrid FEC/ARQ System", 1997 IEEE Global Telecommunications Mini–Conference, vol. 4, Nov. 1999, pp. 55–59.*

* cited by examiner

Primary Examiner—Stephen Baker
(74) Attorney, Agent, or Firm—John T. Whelan; Michael W. Sales

(57) ABSTRACT

A method and apparatus for Turbo encoding uses a set of rate-compatible Turbo Codes optimized at high code rates and derived from a universal constituent code. The Turbo Codes have rate-compatible puncturing patterns. The method comprises: encoding a signal at a first and second encoder using a best rate 1/2 constituent code universal with higher code rates, the first encoder and the second encoder each producing a respective plurality of parity bits for each information bit; puncturing the respective plurality of parity bits at each encoder with a higher rate best puncturing patterns; and puncturing the respective plurality of parity bits at each encoder with a lower rate best puncturing pattern. In a variation, the best rate 1/2 constituent code represents a concatenation of polynomials $1+D^2+D^3$ (octal 13) and $1+D+D^3$ (octal 15), D a data bit. A Turbo Encoder is provided which has hardware to implement the method.

31 Claims, 17 Drawing Sheets

PUNCTURING SCHEMES STUDIED FOR
OPTIMIZING THE RATE 1/4 TURBO CODE

EXAMPLE OF A CDMA COMMUNICATIONS LINK USING TURBO CODES

GENERIC TURBO CODE ENCODER BLOCK DIAGRAM

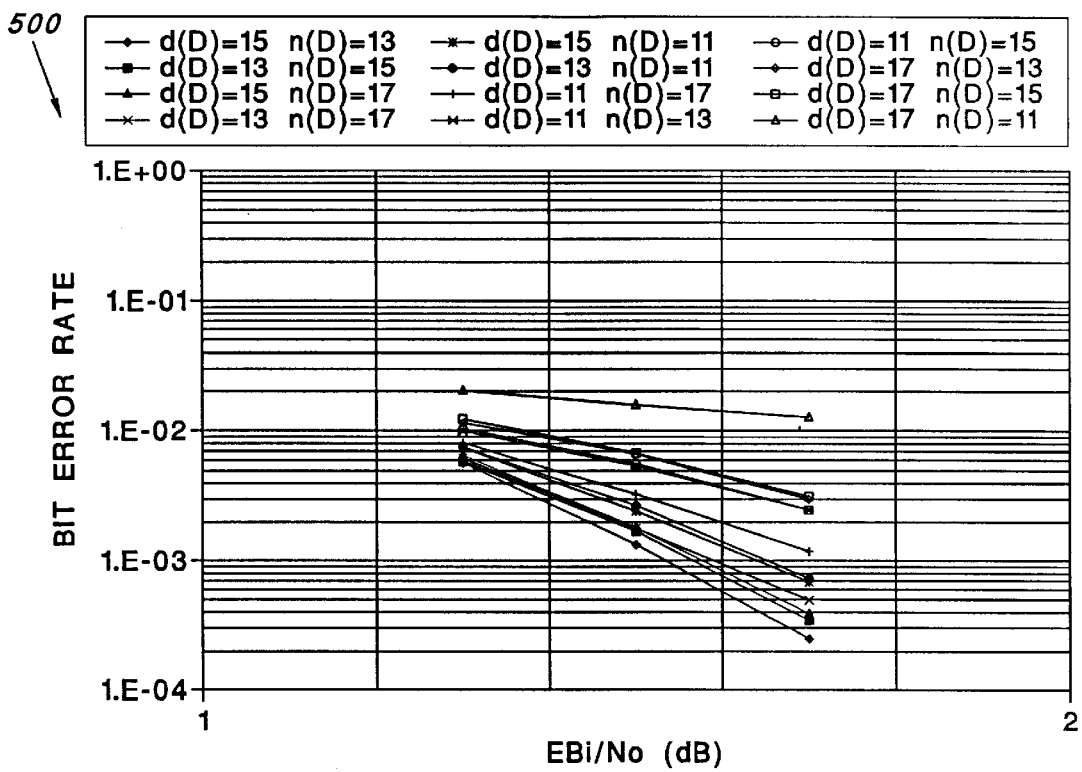
FIG. 5 RATE-1/2 TURBO CODES ON AWGN CHANNEL. (1000 BIT INTERLEAVER, 3 ITERATIONS)
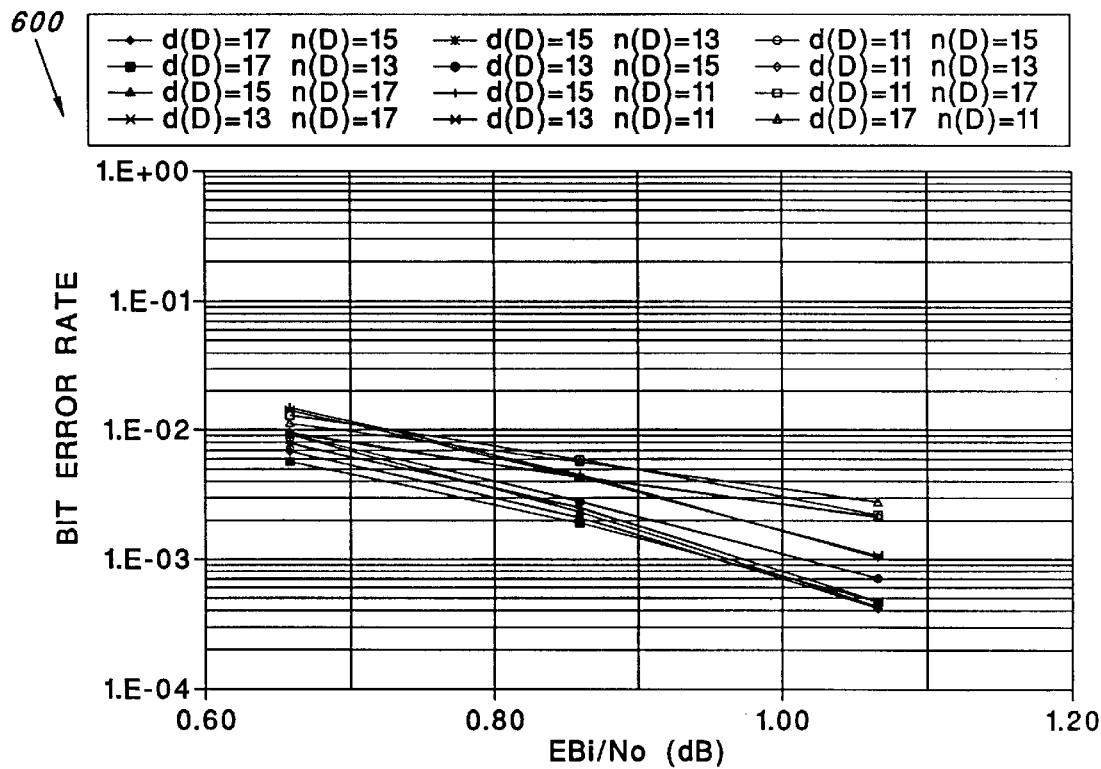
FIG. 6 RATE-1/3 TURBO CODES ON AWGN CHANNEL. (1000 BIT INTERLEAVER, 3 ITERATIONS)

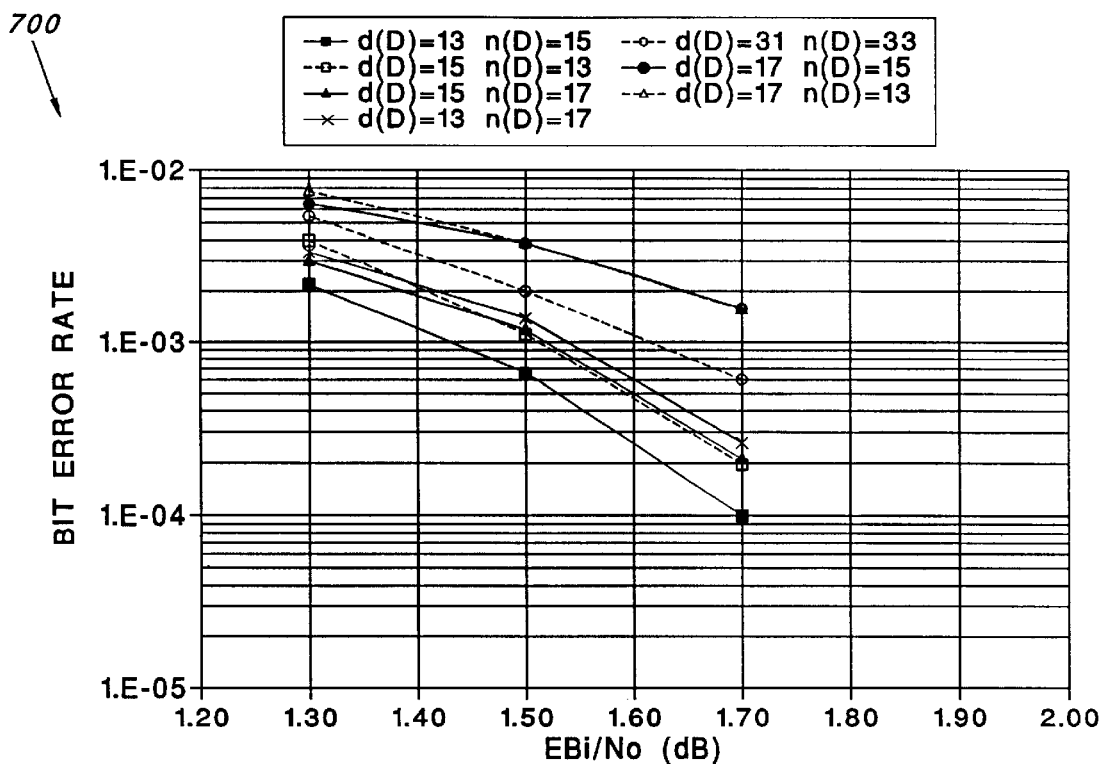
FIG. 7 SELECTED RATE 1/2 TURBO CODES ON AWGN CHANNEL, 512 BIT FRAME SIZE
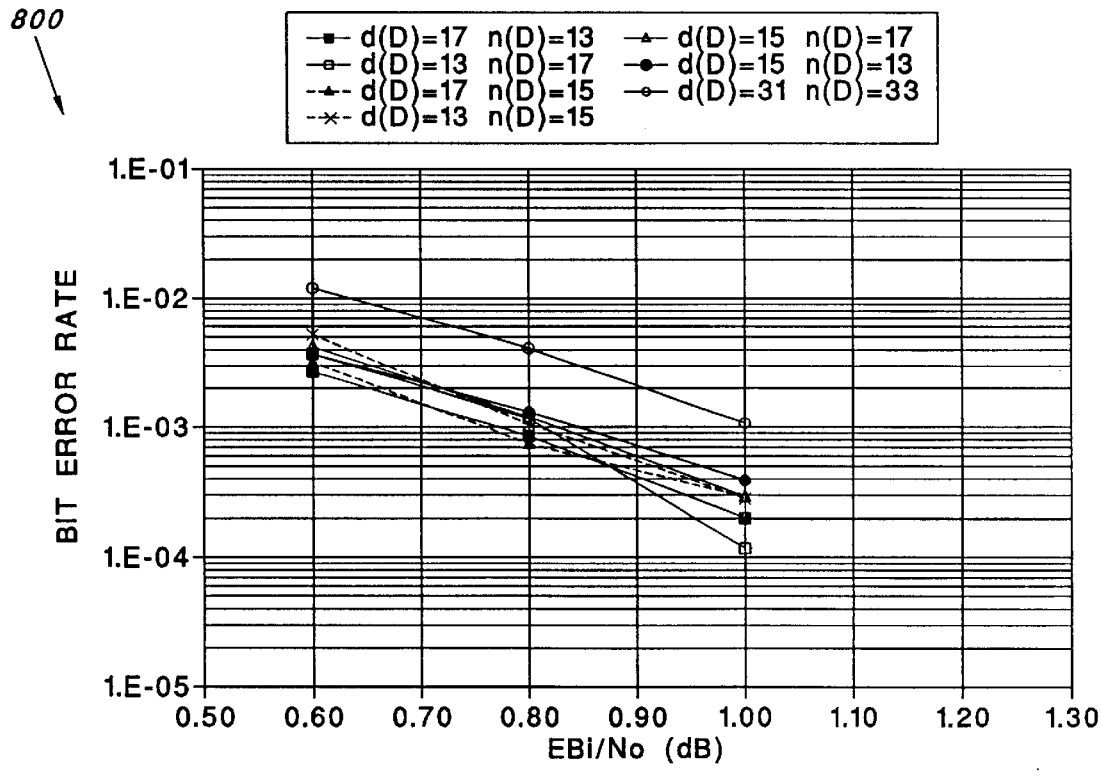
FIG. 8 SELECTED RATE 1/3 TURBO CODES ON AWGN CHANNEL, 512 BIT FRAME SIZE

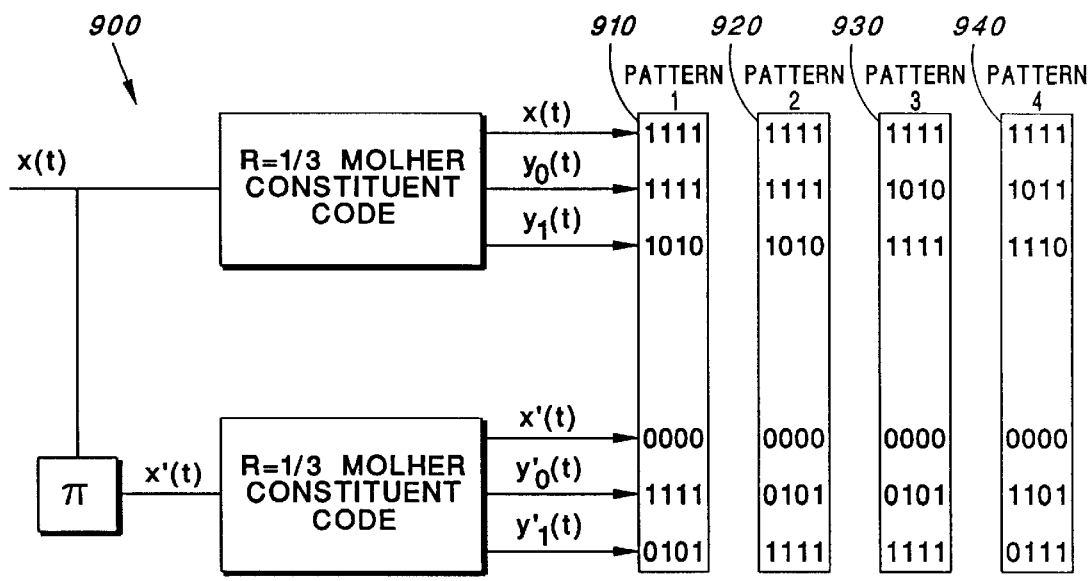
FIG. 9 PUNCTURING SCHEMES STUDIED FOR OPTIMIZING THE RATE 1/4 TURBO CODE
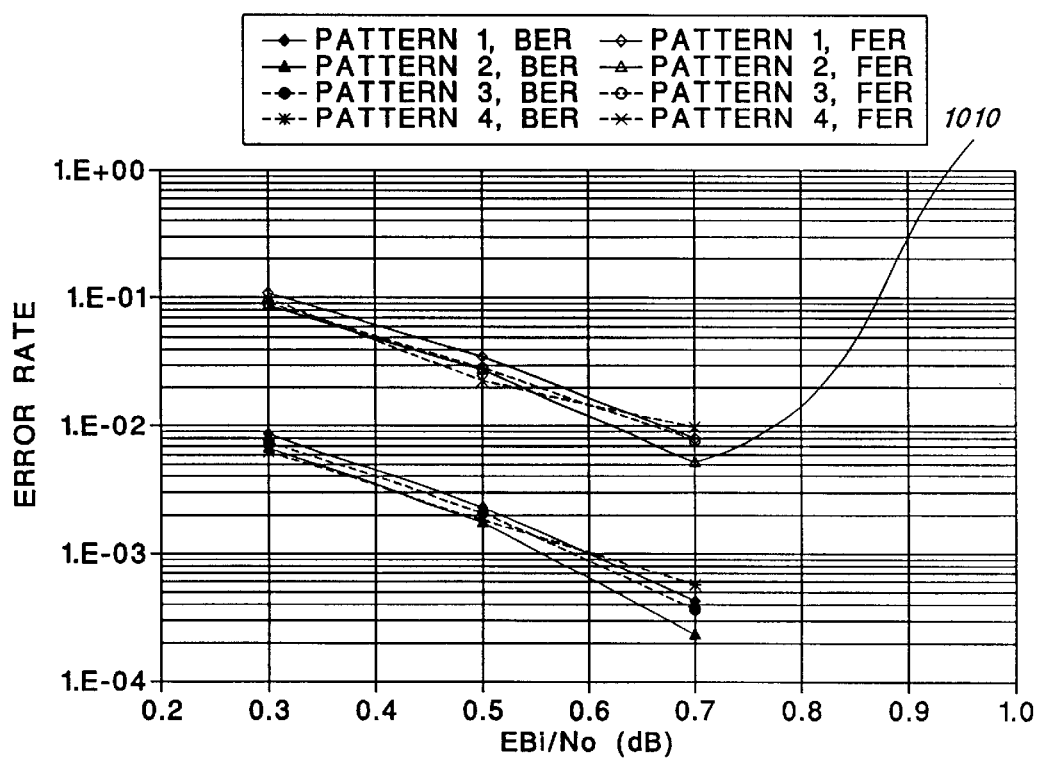
FIG. 10 PERFORMANCE OF CODE #1, FRAME SIZE=512

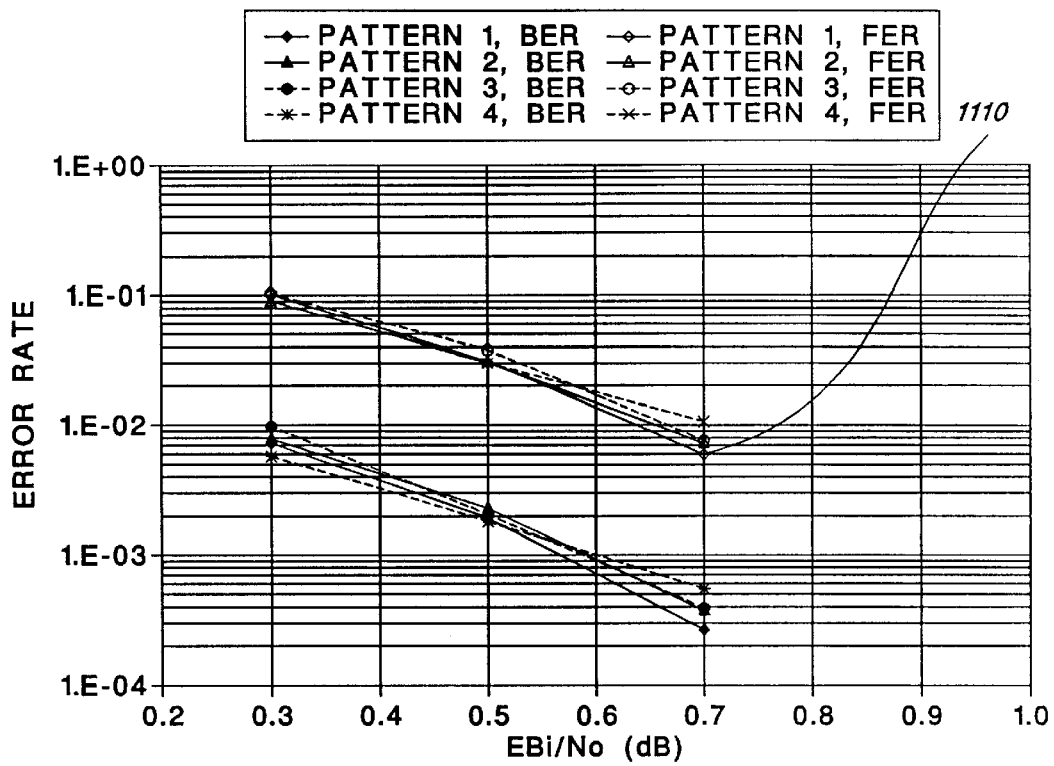
FIG. 11 PERFORMANCE OF CODE #2, FRAME SIZE=512
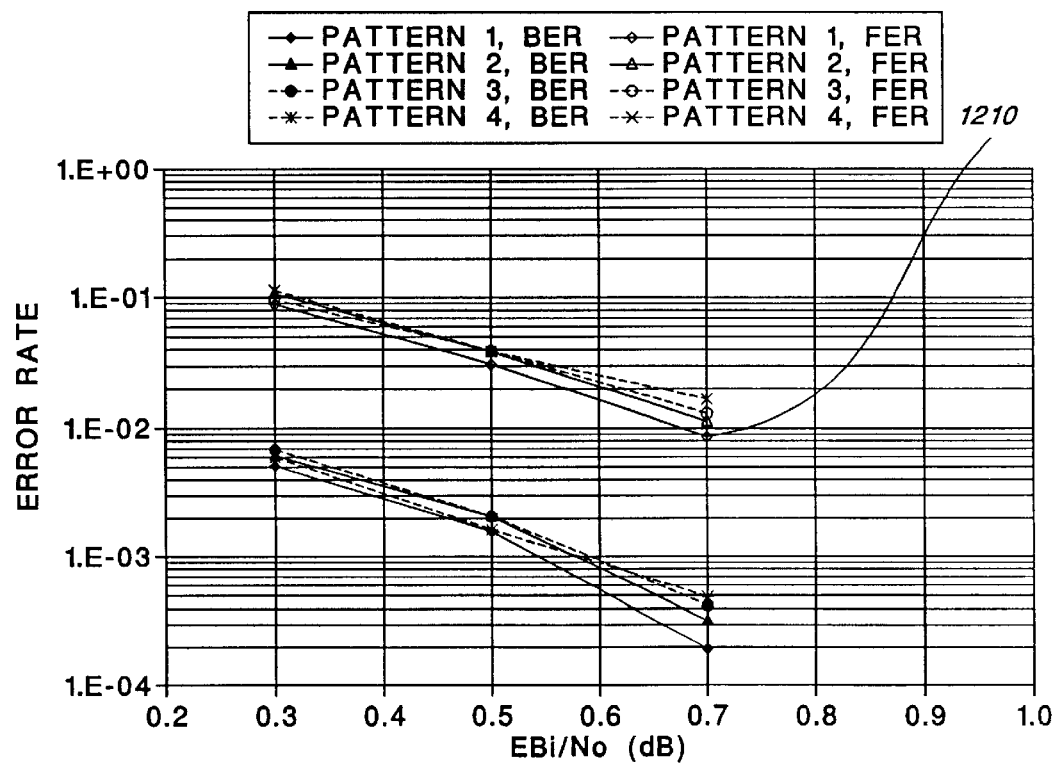
FIG. 12 PERFORMANCE OF CODE #3, FRAME SIZE=512

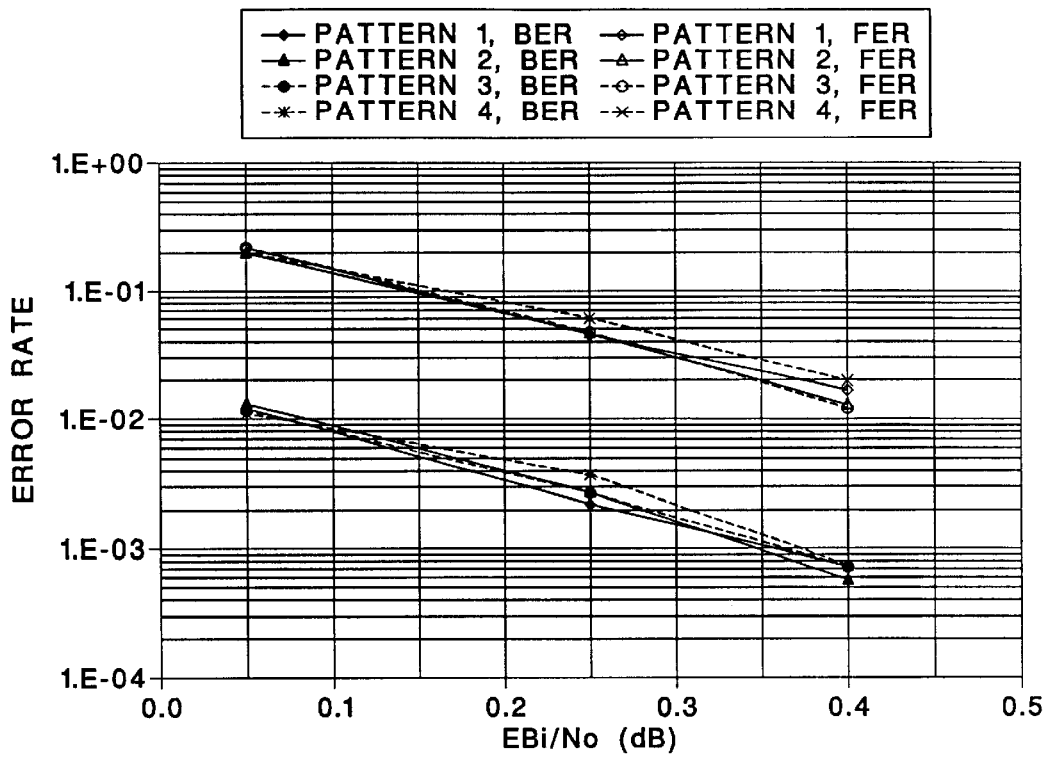
FIG. 13 BER/FER PERFORMANCE OF CODE #1, FRAME SIZE=1024
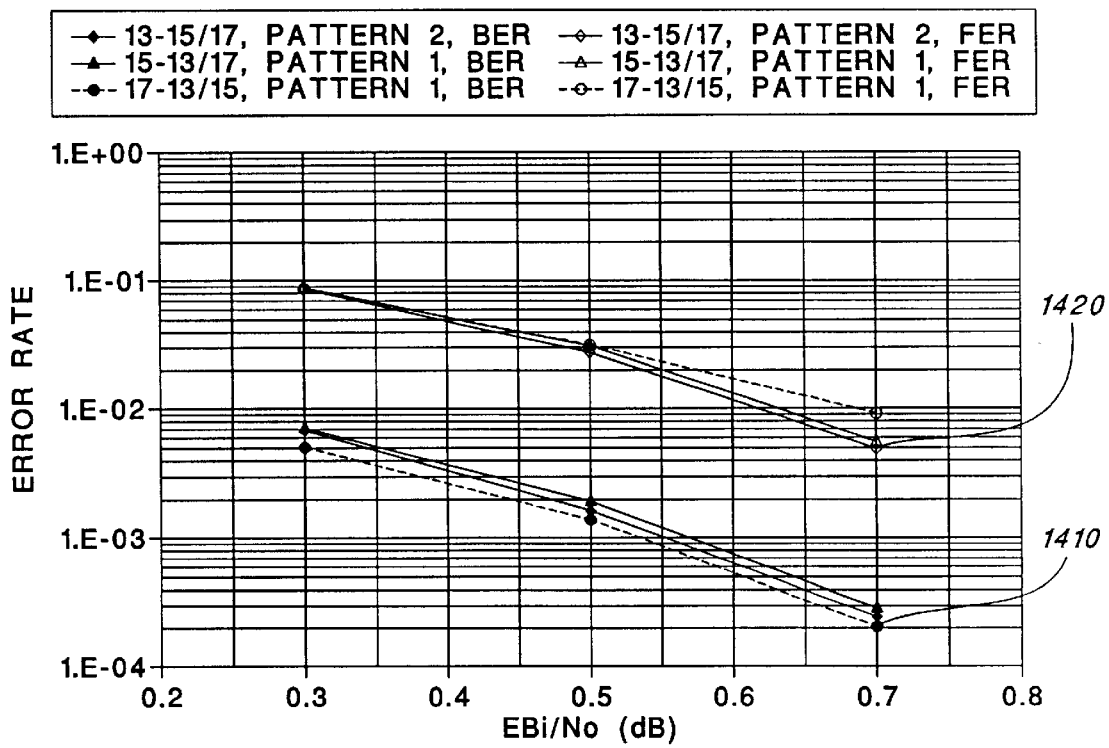
FIG. 14 BER/FER PERFORMANCE OF SELECTED RATE-1/4 TURBO CODES, FRAME SIZE=512

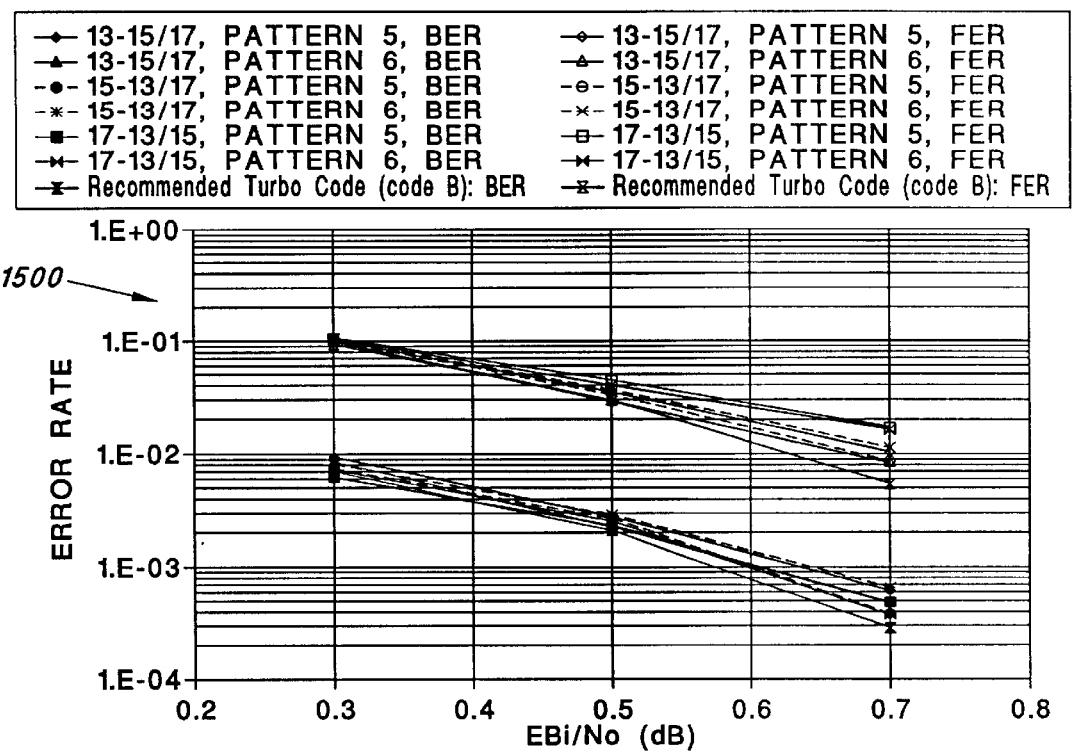
FIG. 15 COMPARISON AGAINST OTHER PUNCTURING SCHEMES, FRAME=512
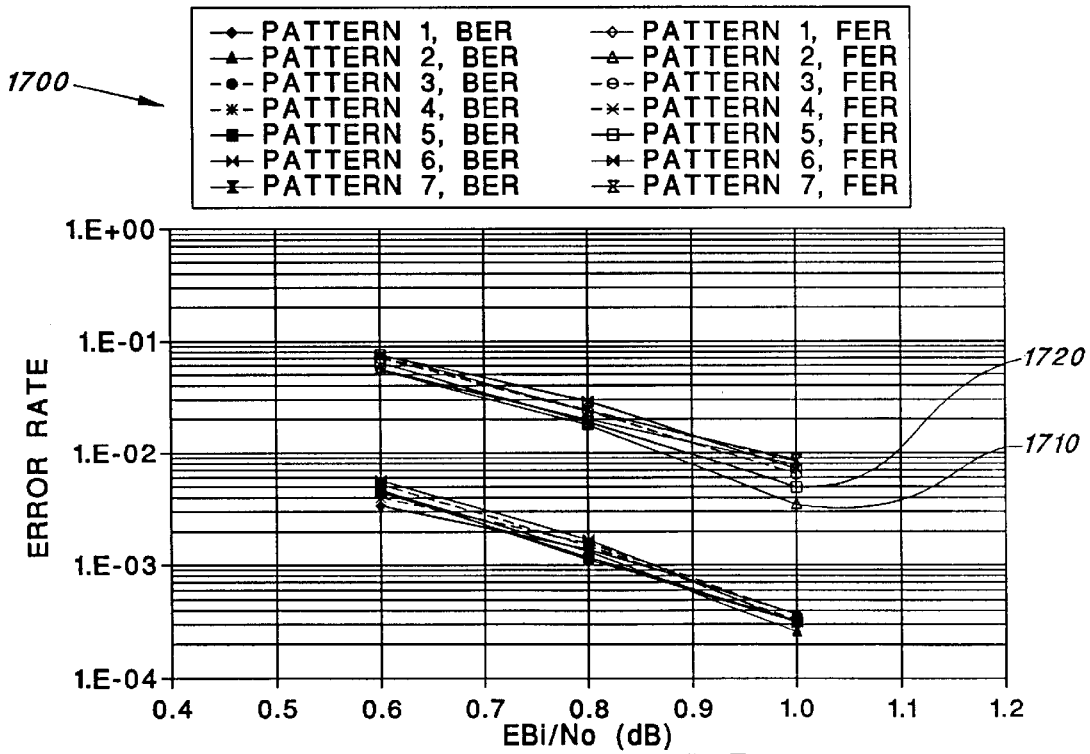
FIG. 17 COMPARISON OF RATE 1/3 PUNCTURING SCHEMES, FRAME=512

*1600*

| | 1602<br>PATTERN 1 | 1604<br>PATTERN 2 | 1606<br>PATTERN 3 | 1608<br>PATTERN 4 | 1610<br>PATTERN 5 | 1612<br>PATTERN 6 | 1614<br>PATTERN 7 | |
|---|---|---|---|---|---|---|---|---|
| | 1111 | 1111 | 1111 | 1111 | 1111 | 1111 | 1111 | ⎬ 1616 — 1620 |
| | 1111 | 0000 | 1010 | 1110 | 1111 | 1110 | 0001 | — 1622 |
| | 0000 | 1111 | 0101 | 0001 | 0000 | 0001 | 1110 | — 1624 |
| | 0000 | 0000 | 0000 | 0000 | 0000 | 0000 | 0000 | ⎬ 1618 — 1626 |
| | 1111 | 0000 | 1010 | 0001 | 1111 | 1110 | 0001 | — 1628 |
| | 0000 | 1111 | 0101 | 1111 | 1111 | 0001 | 1110 | — 1630 |

(a) TURBO CODE RATE = 1/3

| 1640<br>PATTERN 1 | 1642<br>PATTERN 2 | 1644<br>PATTERN 3 | 1646<br>PATTERN 4 |
|---|---|---|---|
| 1111 | 1111 | 1111 | 1111 |
| 1010 | 0000 | 1000 | 1010 |
| 0000 | 1010 | 0010 | 0000 |
| 0000 | 0000 | 0000 | 0000 |
| 0101 | 0000 | 0001 | 0000 |
| 0000 | 0101 | 0100 | 0101 |

(b) TURBO CODE RATE = 1/2

FIG. 16  ESSENTIAL PUNCTURING PATTERNS FOR RATE 1/3 COSTITUENT CODES

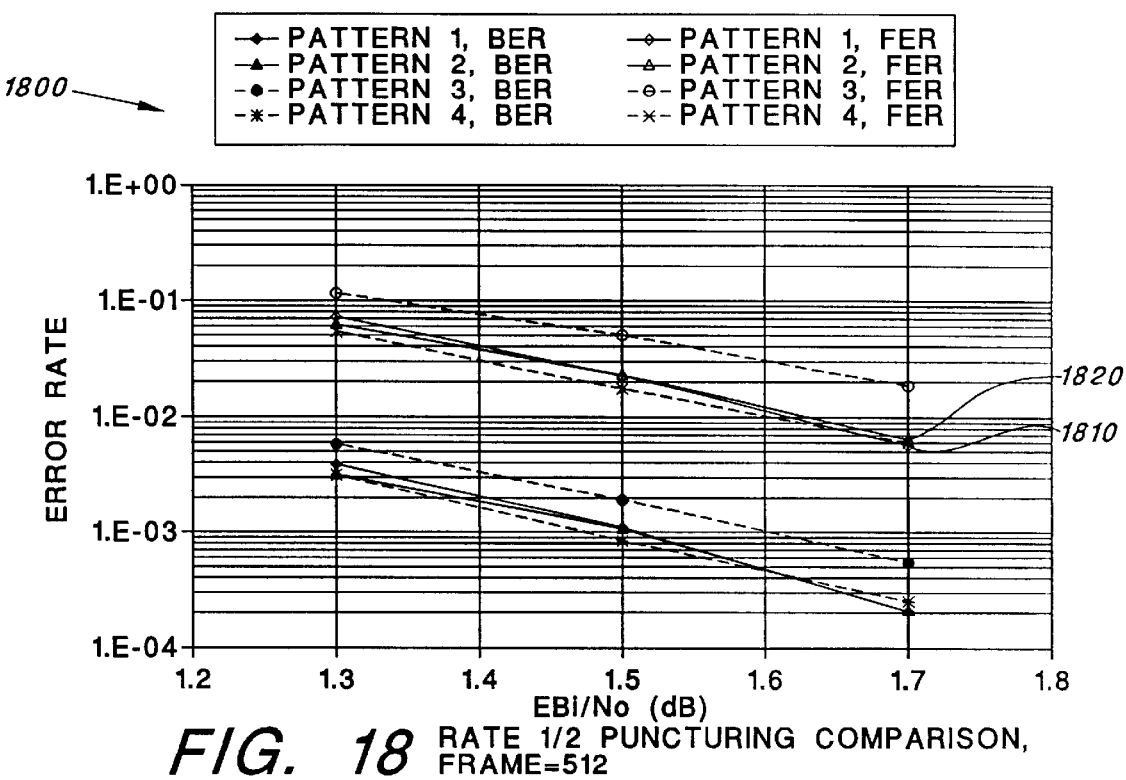
FIG. 18 RATE 1/2 PUNCTURING COMPARISON, FRAME=512
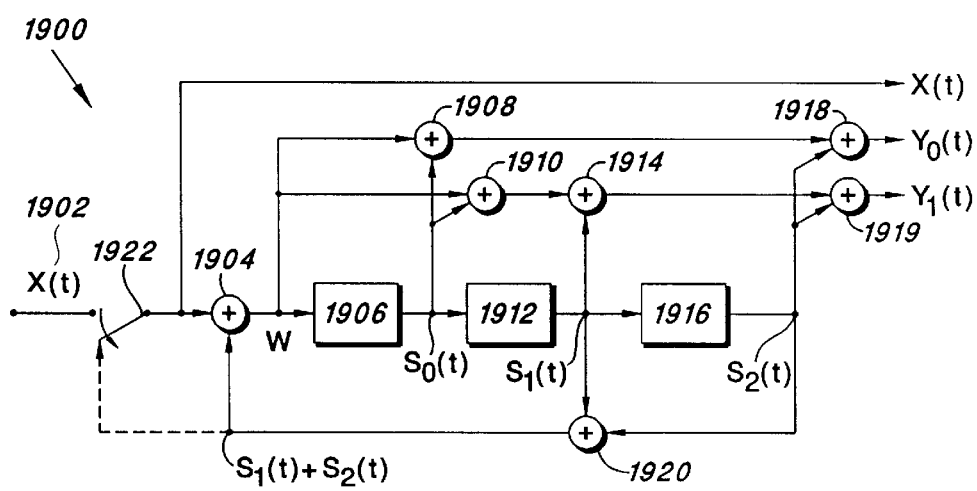
FIG. 19 UNIVERSAL CONSTITUENT ENCODER RECOMMENDED FOR FORWARD LINK TURBO CODES OF VARYING INTERLEAVER DEPTH

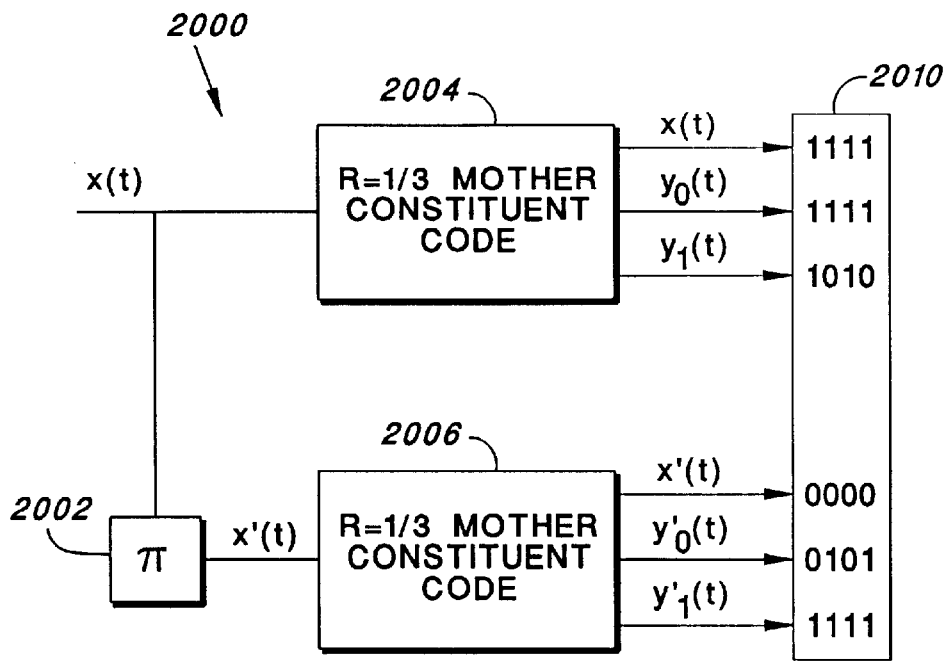
FIG. 20 FORWARD LINK TURBO CODE OF RATE 1/4 (MOTHER CODE IN FIGURE 19)
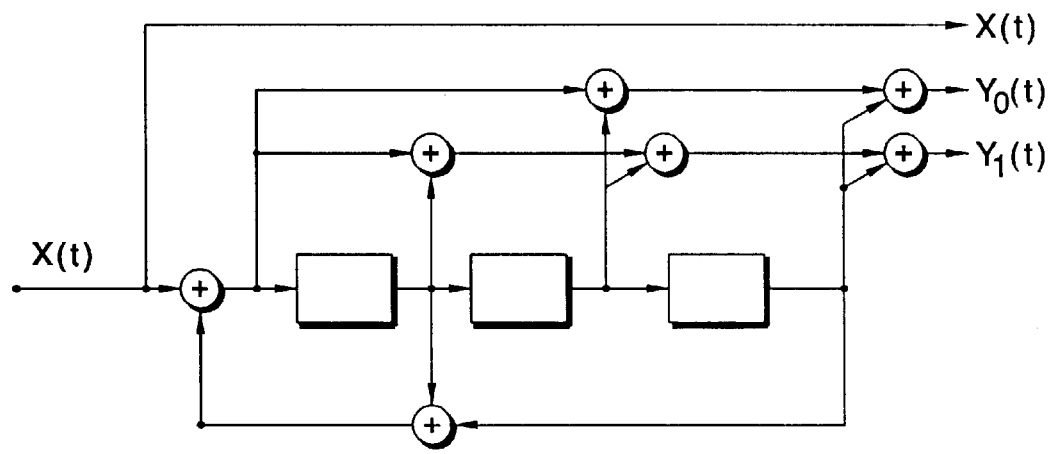
FIG. 25 CONSTITUENT ENCODER FOR REVERSE-LINK TURBO CODE

| PATTERN 1 | PATTERN 2 |
|---|---|
| 111 | 111111 |
| 111 | 111110 |
| 000 | 000000 |
| 000 | 000000 |
| 110 | 110111 |
| 000 | 000000 |

PUNCTURING PATTERNS
FOR RATE 3/8 FORWARD
LINK CODES

| PATTERN 1 | PATTERN 2 |
|---|---|
| 1111 | 11111111 |
| 1101 | 11011010 |
| 0000 | 00000000 |
| 0000 | 00000000 |
| 1010 | 10101101 |
| 0000 | 00000000 |

PUNCTURING PATTERNS
FOR RATE 4/9 FORWARD
LINK CODES

| PATTERN 1 | PATTERN 2 | PATTERN 3 |
|---|---|---|
| 1111 | 1111 | 1111 |
| 1111 | 1011 | 1111 |
| 1011 | 1111 | 1011 |
| 0000 | 0000 | 0000 |
| 1111 | 1110 | 1110 |
| 1110 | 1111 | 1111 |

PUNCTURING PATTERNS FOR RATE 2/9 REVERSE LINK CODES

*FIG. 22* RATE 3/8 FORWARD LINK TURBO CODES, FRAME=512, AWGN CHANNEL

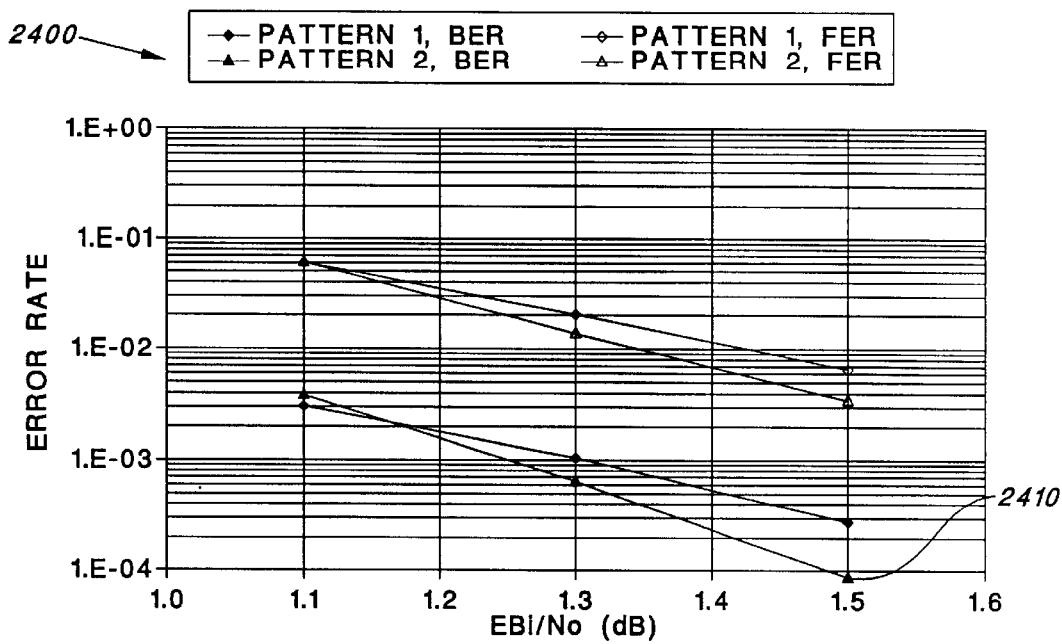
FIG. 24 RATE 4/9 FORWARD LINK TURBO CODES, FRAME=512, AWGN CHANNEL
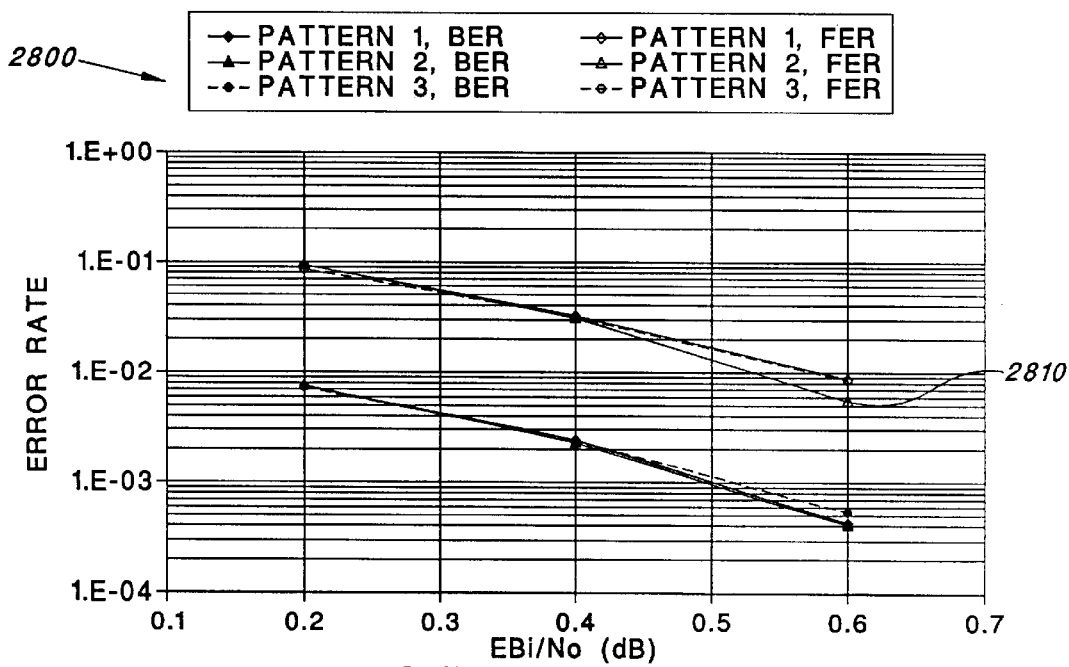
FIG. 28 RATE 2/9 REVERSE LINK TURBO CODES, FRAME=512, AWGN CHANNEL

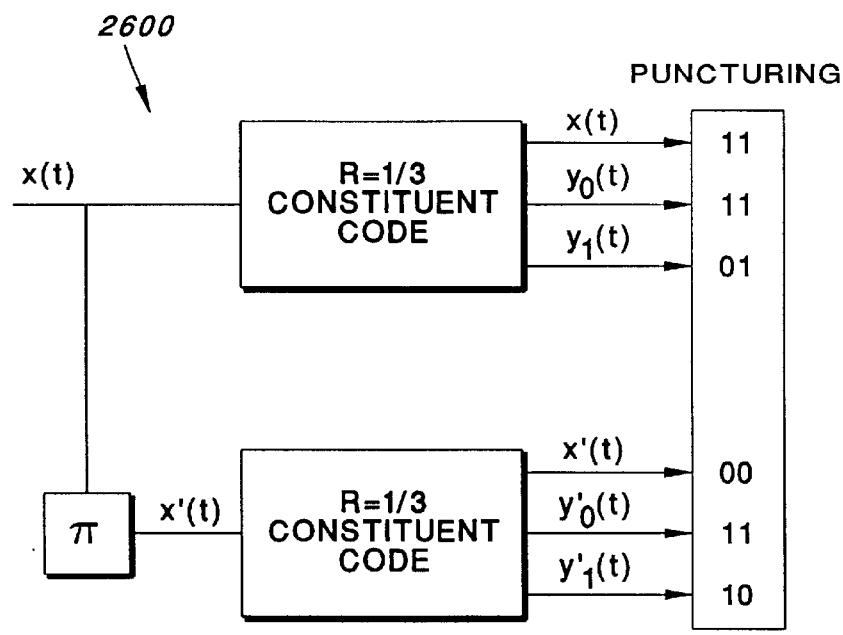
FIG. 26 REVERSE LINK TURBO CODE OF RATE 1/4 (MOTHER CODE IN FIGURE 25)
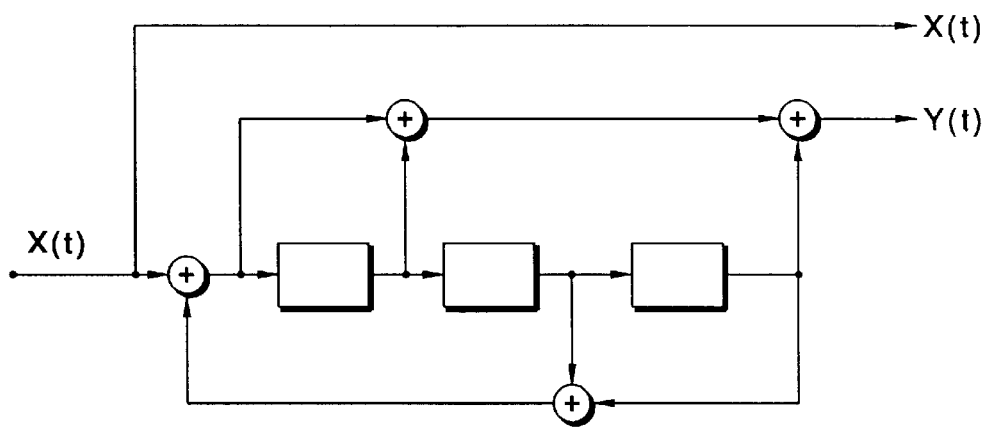
FIG. 31 UNIVERSAL CONSTITUENT ENCODER RECOMMENDED FOR R=1/2 AND R=1/3 TURBO CODES OF VARYING INTERLEAVER DEPTH

| PATTERN 1 | PATTERN 2 | PATTERN 3 |
|---|---|---|
| 111 | 111 | 111 |
| 111 | 110 | 110 |
| 000 | 001 | 001 |
| 000 | 000 | 000 |
| 110 | 110 | 010 |
| 000 | 000 | 100 |

| PATTERN 4 | PATTERN 5 | PATTERN 6 |
|---|---|---|
| 111 | 111 | 111 |
| 100 | 100 | 000 |
| 011 | 011 | 111 |
| 000 | 000 | 000 |
| 010 | 000 | 000 |
| 100 | 110 | 110 |

INITIAL PUNCTURING PATTERNS
FOR RATE 3/8 REVERSE LINK CODES

FIG. 30  RATE 3/8 REVERSE LINK TURBO CODES, FRAME=512, AWGN CHANNEL

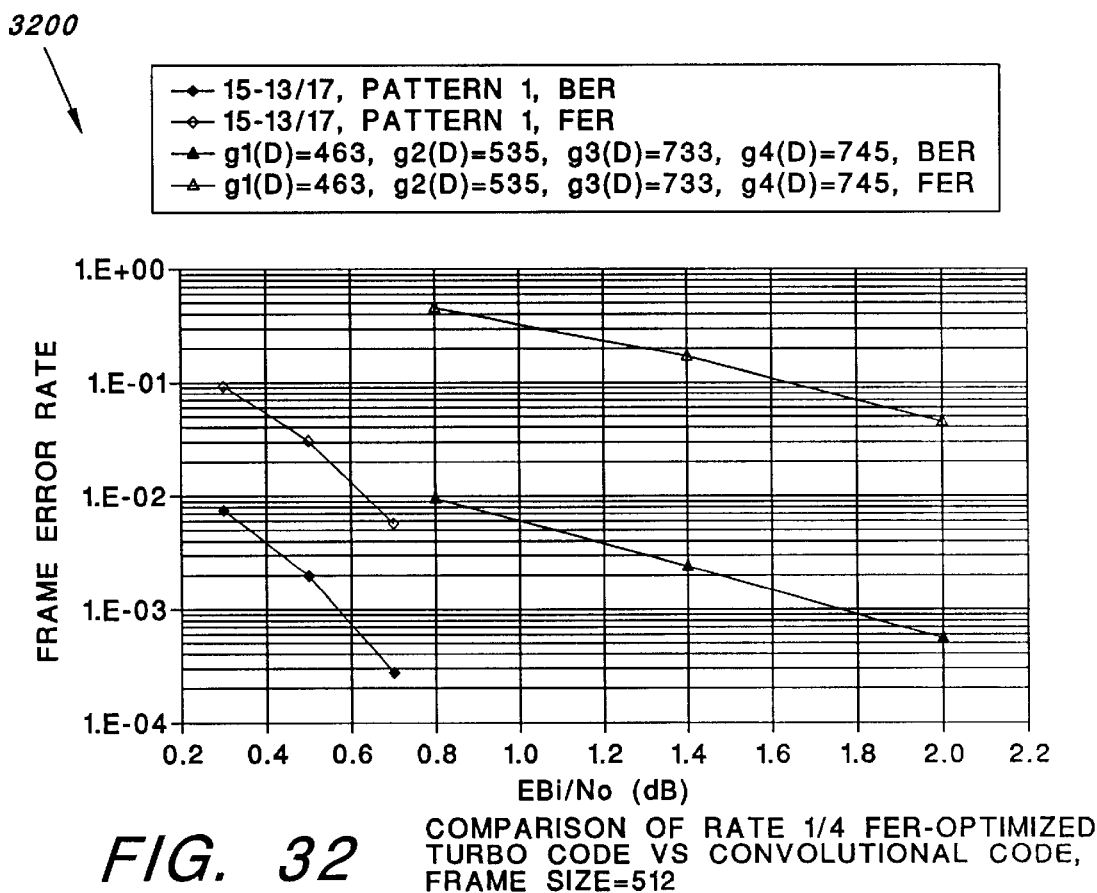
FIG. 32  COMPARISON OF RATE 1/4 FER-OPTIMIZED TURBO CODE VS CONVOLUTIONAL CODE, FRAME SIZE=512

SETS OF RATE-COMPATIBLE UNIVERSAL TURBO CODES NEARLY OPTIMIZED OVER VARIOUS RATES AND INTERLEAVER SIZES

CLAIM FOR PRIORITY

This application claims priority under 35 U.S.C. §1.19(e) of the filing dates of U.S. Provisional Application No. 60/072,368, filed Jan. 23, 1998, now abandoned, No. 60/074,932, filed Feb. 17, 1998, now abandoned, No. 60/075,742, filed Feb. 23, 1998, now abandoned, and No. 60/076,464, filed Mar. 2, 1998, now abandoned, the entire content of each of these provisional applications are incorporated herein by reference.

BACKGROUND OF THE INVENTION

The present invention relates to error correction in data communications, and more particularly, to forward error correction (FEC). Even more particularly, the present invention relates to the selection and use of optimal Turbo Codes in high performance data communication systems, such as emerging third generation terrestrial cellular mobile radio and satellite telephone systems, for which flexibility in supporting a wide range of system requirements with respect to transmission data rates, channel coding rates, quality of service measures (e.g., latency, bit-error rate, frame error rate), and implementation complexity is highly desirable.

Forward error correction (FEC) is required in terrestrial and satellite ratio systems to provide high quality communication over the RF propagation channel, which induces signal waveform and spectrum distortions, including signal attenuation (freespace propagation loss) and multi-path induced fading. These impairments drive the design of the radio transmission and receiver equipment, the design objective which is to select modulation formats, error control schemes, demodulation and decoding techniques and hardware components that together provide an efficient balance between system performance and implementation complexity. Differences in propagation channel characteristics, such as between terrestrial and satellite communication channels, naturally result in significantly different system designs. Likewise, existing communication system continue to evolve in order to satisfy increased system requirements for new higher rate or higher fidelity communication services.

In the case of terrestrial cellular mobile radio telephony, Analog Mobile Phone System (AMPS) is an exemplary first generation system; the U.S. IS-136 and European GSM time-division multiple-access (TDMA) standards and the U.S. IS-95 code-division multiple-access (CDMA) standard are second generation systems; and the wideband CDMA standards currently under development (e.g., CDMA 2000 in the U.S. and UTRA in Europe) are third generation systems.

In the third generation systems the development of flexible, high-speed data communication services is of particular interest. Desirable features include the ability to perform rate adaptation and to satisfy a multiplicity of quality-of-service (QOS) requirements.

Traditional forward error correction (FEC) schemes for communication systems include use of convolutional codes, block codes such as Reed-Solomon or BCH codes, and/or concatenated coding schemes.

Turbo Codes are a relatively new class of block codes that have been demonstrated to yield bit error rate (BER) performance close to theoretical limits on important classes of idealized channels by means of an iterative soft-decision decoding method.

A Turbo encoder consists of a parallel concatenation of typically two systematic, recursive convolutional codes ("constituent codes") separated by an interleaver that randomizes the order of presentation of information bits to a second constituent encoder with respect to a first constituent encoder. The performance of a Turbo Code depends on the choice of constituent codes, interleaver, information block size (which generally increases with higher data rates), and number of decoder iterations. For a particular Turbo Code, in which the constituent codes are fixed, one can ideally adjust the block size and number of decoder iterations to tradeoff performance, latency and implementation complexity requirements. As the block size changes, however, a new interleaver matched to that block size is required.

In a CDMA network with synchronized base stations, forward link channels (from base station to user terminal) can be designed to be orthogonal, using, for example, Walsh-Hadamand spreading sequences. This is generally not possible, however, for reverse link channels (from user terminal to base station), which therefore operate asynchronously using spreading sequences that are only quasi-orthogonal. Thus, the reverse links in a synchronous CDMA network typically experience more interference and therefore may require stronger FEC (via lower rate codes) than the forward link channels do.

In an asynchronous CDMA network, the forward and reverse link channels are more similar in terms of interference levels, so it is possible to use a common FEC scheme (or at least more similar FEC schemes) on the two links.

The flexibility and high performance of Turbo Codes make them a potentially attractive technology for sophisticated data communications services. It is therefore desirable to identify Turbo Codes and Turbo coding FEC schemes that best match diverse service requirements with respective data rates and coding rates while minimizing implementation complexity.

The present invention advantageously addresses the above and other needs by providing methods for designing and using universally optimized Turbo Codes and rate-compatible puncturings to support incremental redundancy schemes such as automatic repeat request (ARQ).

SUMMARY OF THE INVENTION

In its most basic form, the invention can be characterized, in one embodiment as a method of processing data, in data services, with a set of rate-compatible Turbo Codes optimized at high code rates and derived from a universal constituent code, the Turbo Codes having compatible puncturing patterns. The method comprises: encoding a signal at a first and second encoder using a best rate 1/2 constituent code universal with higher and lower code rates, the first encoder and the second encoder each producing a respective plurality of parity bits for a data bit; puncturing the respective plurality of parity bits at each encoder with a higher rate best puncturing pattern; and puncturing the respective plurality of parity bits at each encoder with a lower rate best puncturing pattern.

In a variation, a method of processing data in data services uses a set of rate-compatible Turbo Codes derived from an optimal universal rate 1/3 constituent code, the Turbo Codes having similar constituent codes and compatible puncturing patterns, and comprises: encoding a signal with a best rate 1/3 constituent code at a first and a second encoder, each encoder producing a respective plurality of parity bits for each data bit; puncturing the plurality of parity bits with the a higher rate best puncturing pattern; and puncturing the plurality of parity bits with a lower rate best puncturing pattern.

In another variation, a method of rate-compatible Turbo encoding uses a set of rate-compatible Turbo Codes, the set optimized for code rate 1/4, comprising Turbo Codes with differing code rates and rate-compatible puncturing patterns. The method comprises: encoding a signal at a first and second encoder using a best rate 1/4 constituent code universal with higher and lower code rates, the first encoder and the second encoder each producing a respective plurality of parity bits for a data bit; puncturing the respective plurality of parity bits at each encoder with a higher rate best puncturing pattern; and puncturing the respective plurality of parity bits at each encoder with a lower rate best puncturing pattern.

In another embodiment, an encoding system uses a set of rate-compatible Turbo Codes derived from a best universal rate 1/2 constituent code, the set having compatible puncturing patterns, and comprises: a first and second encoder, each encoder comprising: a plurality of shift registers; a plurality of adders each adder coupled to a selected portion of the adders in a configuration corresponding to the best universal rate 1/2 constituent code; and a puncturer configured with the first and second encoder to puncture a plurality of data outputs from each of the first and second encoder, the puncturing determined by a desired Turbo Code rate in accordance with the set of the compatible puncturing patterns.

In a further variation, an encoding system uses a set of rate-compatible Turbo Codes derived from an optimal universal rate 1/3 constituent code, the rate compatible Turbo Codes having similar constituent codes and compatible puncturing patterns, and comprises: a first and second encoder, each encoder comprising: a plurality of shift registers; a plurality of adders, each of the adders coupled to a selected portion of the adders in a configuration corresponding to the rate 1/3 constituent code of; and a puncturer configured with the first and second encoder such to puncture a plurality of data outputs from the first and second encoder, the puncturing determined by a desired Turbo Code rate in accordance with the set of the compatible puncturing patterns.

Yet another variation of the system uses a set of rate-compatible Turbo Codes comprising Turbo Codes having a universal constituent code and rate-compatible puncturing patterns for different code rates, and comprises: a plurality of shift registers; a plurality of adders each adder coupled to a selected portion of the plurality of adders in a configuration corresponding to the universal constituent code; and a puncturer configured with the first and second encoder for puncturing a plurality of data outputs from the first and second encoder, the puncturing determined by a desired Turbo Code rate in accordance with the set of compatible puncturing patterns.

BRIEF DESCRIPTION OF THE DRAWINGS

The above and other aspects, features and advantages of the present invention will be more apparent from the following more particular description thereof, presented in conjunction with the following drawings wherein:

FIGS. 5, 6, 7, 8 illustrate the Bit Error Rate (BER) performance against signal to noise ratio (SNR) for Turbo Code rates 1/2 and rate 1/3 at Interleaver sizes 1000, 512 and 1024 bits when the Turbo Codes use a candidate constituent code represented by d(D) and n(D);

FIG. 9 illustrates the puncturing schemes studied for optimizing the rate 1/4 Turbo Codes;

FIGS. 10, 11, 12 illustrate the BER/FER performance of Constituent Codes #1–3 at a frame size of 512 bits;

FIG. 13 illustrates the BER/FER performance of Constituent Code #1, wherein Constituent Code #1 is at a frame size of 1024 bits, and with consistent results found at sizes 2048 and 3072 bits, respectively;

FIG. 14 illustrates the BER/FER performance of selected rate 1/4 Turbo Codes at frame size 512, with consistent results found at sizes 1024, 2048 and 3072 bits, respectively;

FIG. 15 is a comparison of preferred Turbo Code B against other puncturing schemes at frame size 512 bits;

FIG. 16 is a lay-out of candidate puncturing patterns for Turbo Codes of rate 1/3 and 1/2 when the constituent codes have rate 1/3;

FIG. 17 illustrates a comparison of rate 1/3 puncturing schemes at frame size 512 bits;

FIG. 18 illustrates rate 1/2 puncturing schemes at frame size 512 bits, with consistent results found at 1024, 2048 and 3072 bits, respectively;

FIG. 19 illustrates a block diagram of a preferred universal constituent encoder for Turbo Codes optimized at code rate 1/2 and rate 1/3 of varying Interleaver depths;

FIG. 20 is a functional block diagram for rate 1/4 Turbo Codes optimized at code rate 1/2 and rate 1/3, including interleaving and puncturing, (rate 1/3, and rate 1/2 use analogous processing);

FIG. 22 illustrates rate 3/8 Turbo Codes optimized at code rate 1/2 and rate 1/3 at frame size 512 bits, wherein results are consistent at 1024, 2048 and 3072 bits, respectively;

FIG. 24 illustrates rate 4/9 Turbo Codes optimized code rate 1/2 and rate 1/3 using frame size 512 bits;

FIG. 25 is a functional block diagram of a preferred constituent encoder for a Turbo Codes optimized at code rate 1/4;

FIG. 26 illustrates a functional block diagram of a rate 1/4 Turbo Codes optimized at rate 1/4, including interleaving and puncturing, (rate 1/3 and rate 1/2 use analogous processing);

FIG. 28 illustrates rate 2/9 Turbo Codes optimized at code rate 1/4 using frame size 512 bits;

FIG. 30 illustrates rate 3/8 Turbo Codes optimized at code rate 1/4 using frame size 512 bits;

FIG. 31 is a functional block diagram of a preferred universal constituent encoder for rate 1/2 and rate 1/3 Turbo Codes of varying Interleaver depths; and FIG. 32 illustrates a performance comparison of rate 1/4 FER-optimized Turbo Codes with convolutional codes, at frame size 512 bits, wherein results are consistent at 1024, 2048 and 3072 bits.

DETAILED DESCRIPTION OF THE PREFERRED EMBODIMENT

The following description of the presently contemplated best mode of the invention is not to be taken in a limiting sense, but is made merely for the purpose of describing the general principles of the invention. The scope of the invention should be determined with reference to the claims.

There are two primary aspects of the current invention: 1) forward error correction (FEC) schemes for data services based on specific 'universal' Turbo Codes demonstrated to provide near-optimal performance over a wide range of information block sizes and code rates; and 2) the method by which specific Turbo Codes having the above mentioned desirable properties can be designed.

Turbo Codes are particularly well-suited to data applications because of their excellent error correction capabilities at low signal-to-noise (SNR) ratios and their flexibility in trading off bit error rate (BER) and frame error rate (FER) performance for processing delay. The data services under consideration in the hereinafter-described embodiments are consistent with third generation Code Division Multiple Access (CDMA) cellular mobile radio standards currently in development and are typically more delay-tolerant than low-rate voice services.

The universal Turbo Codes specified herein (and the method of finding such codes), however, are also applicable to data services in other cellular mobile radio systems (e.g., the European Time-Division Multiple Access (TDMA) standard used in GSM) as well as other systems, such as satellite or other wireless communications systems. Several specific Turbo Codes are therefor identified that provide different optimizations regarding these requirements. Others would also be possible.

In order to optimize the performance of Turbo Codes for data services, it is desirable to have a set of "universal" constituent codes that provide optimal or nearly optimal performance in conjunction with a variety of different Interleaver depths and Turbo Code rates, thus avoiding tailoring each optimization of particular Turbo Codes.

Figure 1:
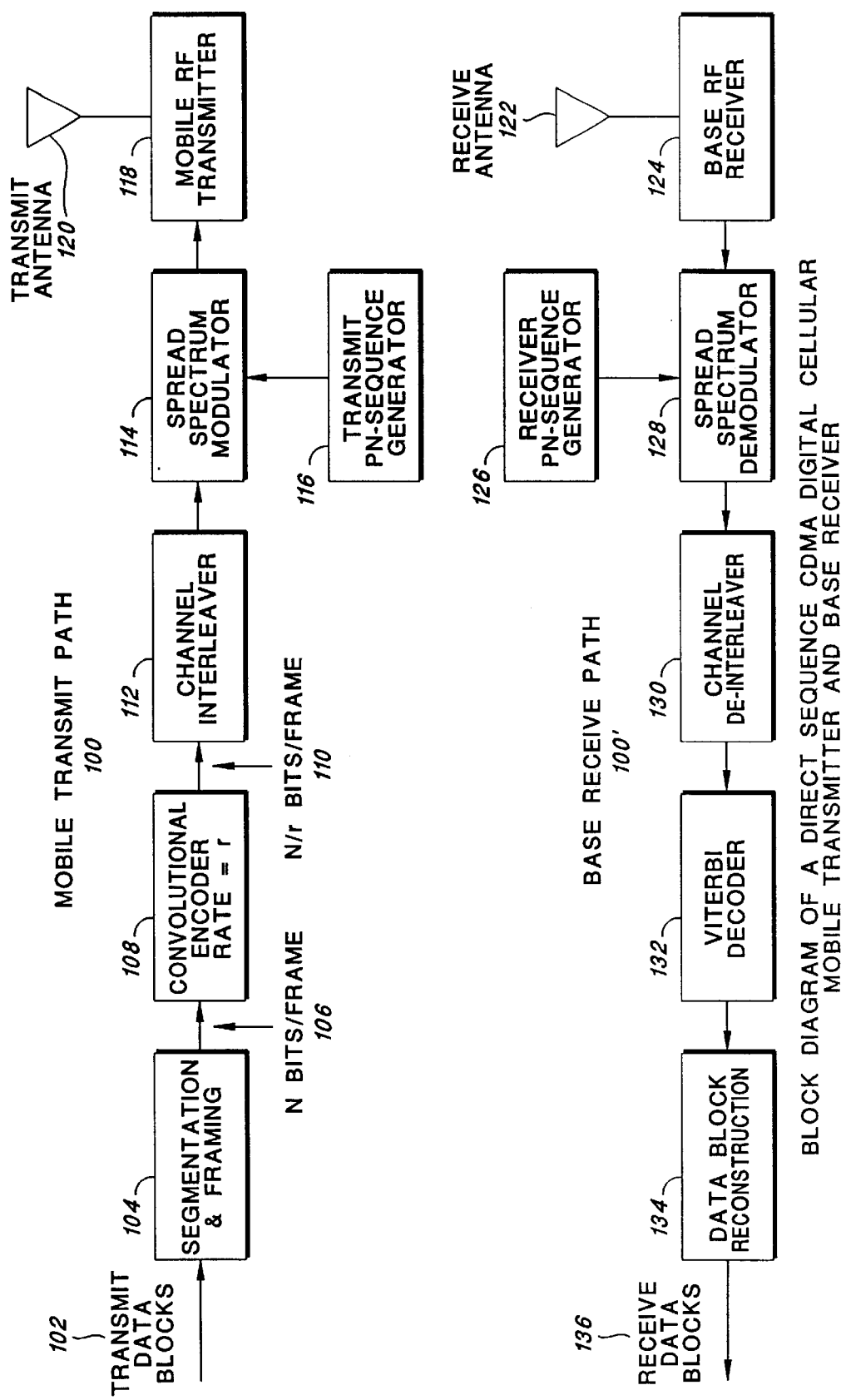
FIG. 1 is a diagram of a code-division multiple-access (CDMA) digital cellular mobile radio system hardware.

Referring first to FIG. 1, an exemplary conventional digital cellular mobile radio system using Direct Sequence Code Division Multiple Access (CDMA) Mobile-station-to-base-station (or reverse) link is shown using a convolutional encoder and a Viterbi decoder. This basic coding and interleaving can be applied, equally well, to other multiple access systems such as the Time Division Multiple Access (TDMA) used in a well-known GSM standard.

FIG. 1 also represents a base-station-to-mobile-station (or forward) link in a cellular mobile radio system. At a transmitting system 100, the system comprises a segmentation processor 104 where user information bits from a data terminal equipment (not shown) are assembled into fixed length frames of N bits per frame 106 which are input to a convolutional encoder 108, (of rate r). Convolutional encoder 108 is coupled to a synchronization and framing processor 104 which produces N/r code symbols 110 at an input of a Channel Interleaver 112 coupled to the convolutional encoder 108. The channel interleaver 112 performs pseudo-random shuffling of code symbols 110 and outputs the code symbols 110 to a Spread Spectrum modulator 114 coupled to the channel interleaver 112. The Spread Spectrum modulator 114 uses a user specific Transmit PN-code generated by a PN converter 116 coupled to the Spread Spectrum modulator 114 to produce a spread spectrum signal carried on a RF carrier to a mobile RF transmitter 118. Mobile RF transmitter 118 is also coupled to the Spread Spectrum modulator 114, where a high power amplifier (not shown) coupled to a transmit antenna 120 radiates a signal to a base station. The techniques of spread spectrum modulation and RF transmission are well known art to one familiar with spread spectrum communication systems.

A signal from a mobile station (a mobile signal) received at a base station receive antenna 122 is amplified in a base RF receive 124 and demodulated in a spread spectrum demodulator 128 using the same PN-code used by the mobile RF transmitter 118 to D-spread the signal. The demodulated symbols are D-interleaved by a channel D-interleaved 130 and input to a Viterbi decoder 132. The decoded information bit are reconstructed into receive data blocks 136 and forwarded to the data terminal equivalent at the end of the system.

Figure 2:
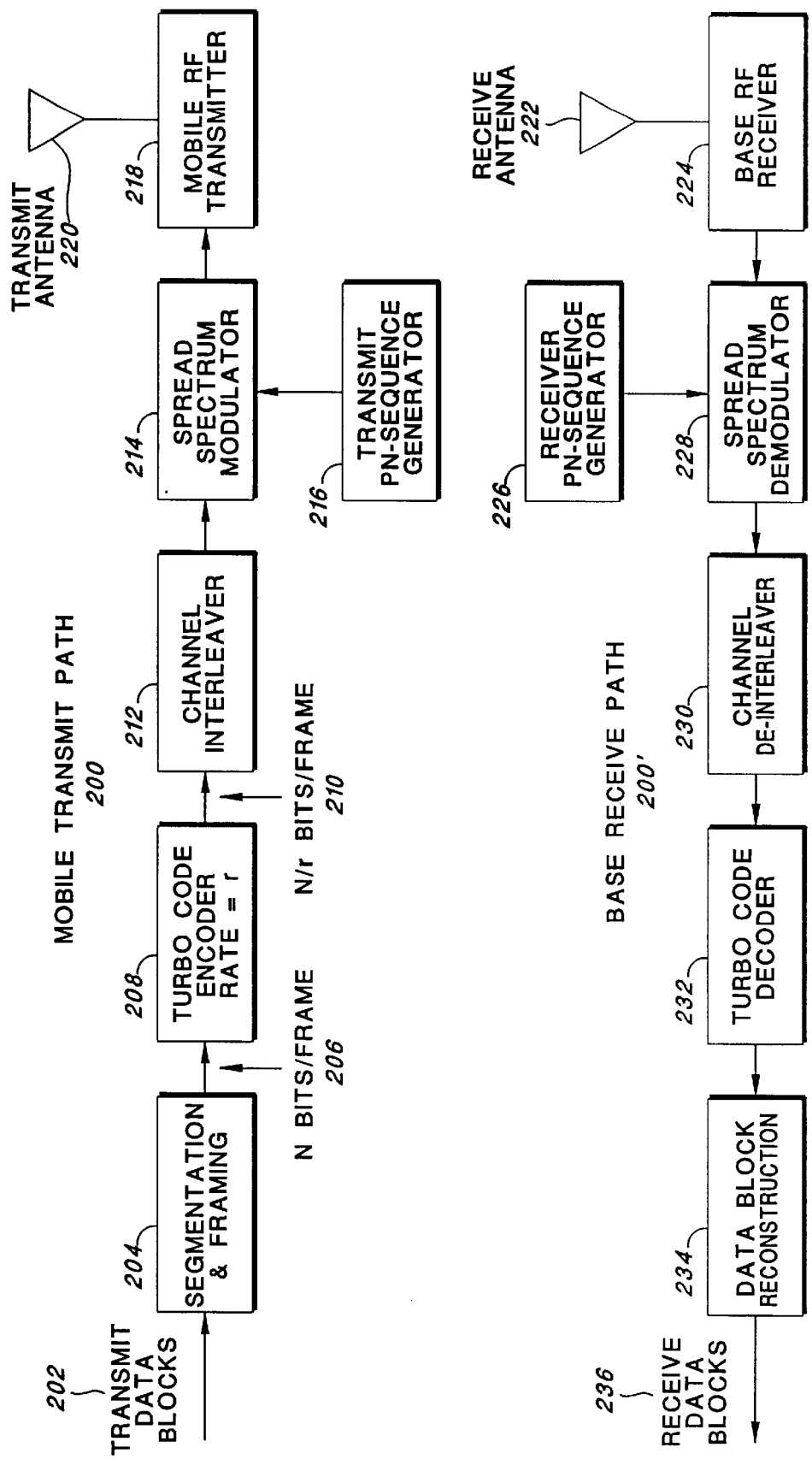
FIG. 2 is a diagram of a CDMA digital cellular mobile radio system hardware which can implement an embodiment of the present invention.

Referring next to FIG. 2, a hardware system for a digital cellular mobile radio system is shown which implements an embodiment of the present invention. As before, a reverse link is illustrated although the same block diagram represents a forward link. Further, while the CDMA system is used as an example, one familiar with the art would consider the present invention applicable to other systems such as TDMA as well.

Transmit data blocks 202 from data terminal equipment is segmented and framed at a Segmentation Processor 204 into fixed frame length and applied to a Turbo Code encoder 208. An output from the encoder 208 is fed to a Channel Interleaver 212 to pseudo-randomize the code symbols. The Channel Interleaver 212 provides output to a Spread Spectrum Modulator 214 which uses a user specific PN-code from a PN Generator 216 to create a spread spectrum signal, carried on a RF carrier to a mobile RF transmitter 218. The channel interleaver 212 is distinguished from a Turbo Code interleaver (not shown) which is a component of the encoder 208. The mobile RF Transmitter 218, coupled to a Transmit Antenna 220, uses a high power amplifier (not shown) at the Transmit Antenna 220 to radiate the signal to the base station.

A signal from the mobile station received at a base receive antenna 222 is amplified in a base RF receiver 224 and demodulated in a spread Spectrum demodulator 228, which uses the same PN-code as used by the mobile RF transmitter 218, to de-spread the signal. The demodulated symbols are de-interleaved by the Channel DE-Interleaver 230, and input to the Turbo Code decoder 232. Decoded information bits from Turbo Code decoder 232 are reconstructed at a Reconstruction Processor 234 into receive data blocks 236 and forwarded to the data terminal equipment at the receive end.

Figure 3:
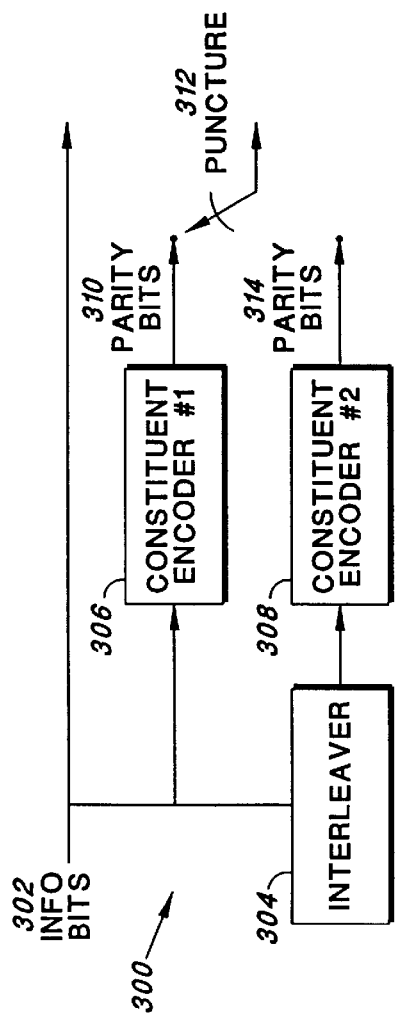
FIG. 3 is a functional block diagram of a Turbo Code encoder modified for use with the present invention.

Referring to FIG. 3, the basic structure of a Turbo Code is characterized by the parallel concatenation of two simpler constituent codes at encoder #1 306 and encoder #2 308. Both constituent encoders, i.e., encoder #1 306 and encoder #2 308 process the same information bit stream 302, but the encoder #2 308 processes information bits 302 in a different order than the order in which encoder #1 306 processes the information bits 302, since the Interleaver 304 reorders the information bits in a pseudo-random manner before they reach encoder #2 308 (the constituent encoder 308). This arrangement reduces the likelihood that a sequence of information bits 302 causing encoder #1 306 to produce a low-Hamming weight output 310 would also cause encoder #2 308 to do the same with its output 314, which makes possible the excellent performance of Turbo Codes.

Both encoders 306, 308 produce, in addition to the information bits 302 (also referred to as systematic bits 302), parity bits 310, 314 which are punctured by puncturer 312 to achieve a desired overall Turbo Code rate. It is also possible to puncture systematic bits.

The constituent codes of a Turbo Code are usually systematic, recursive convolutional codes. The simplest and most widely known recursive convolutional codes have rate 1/2 and transfer function:

$$G(D)=[1, n(D)/d(D)],$$

where n(D) and d(D) are binary polynomials specifying the feed forward and feedback connections of the encoder, respectively.

The rate of a Turbo Code is changed by changing the selection of output bits 310, 314 for puncturing or transmitting. In all the cases herein, a "1" indicates transmitting; a "0" indicates puncturing.

FIG. 3 also shows how two possible puncturing patterns result from puncturer 312. Alternately puncturing the parity bits between encoder 306 and 308 result in a Turbo Code rate r=1/2. Transmitting all of the parity bits at the two encoders 306, 308 produce a code rate r=1/3.

It is not possible to achieve lower Turbo Code rates lower than 1/3 without either increasing the number of constituent encoders or increasing the number of output parity bits per constituent encoder. The latter is usually preferred in order to reduce implementation complexity. In this case, one considers a rate 1/3 systematic, recursive convolutional code with transfer function:

$$G(D)=[1, n_1(D)/d(D), n_2(D)/d(D)].$$

Using two such constituent codes provides any Turbo Code rate between 1/5 and 1 through puncturing, or deleting.

Figure 4:
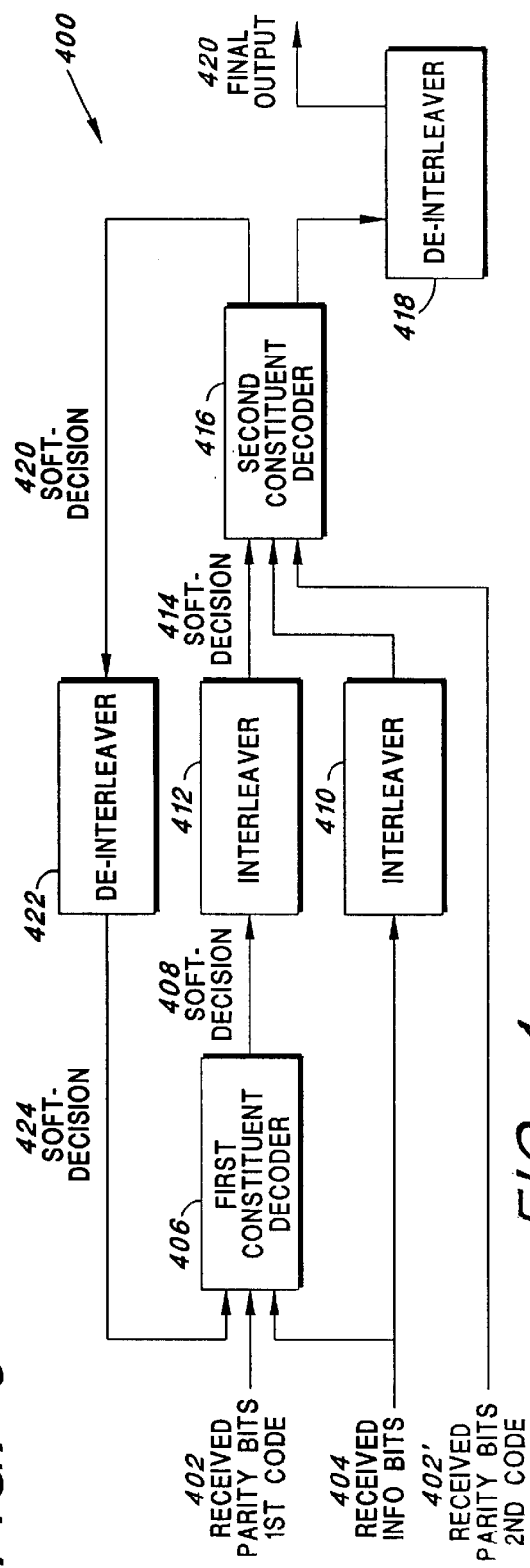
FIG. 4 is a functional block diagram of a generic turbo decoder.

Turbo Codes are decoded using iterative decoding methods as shown in the block diagram of FIG. 4.

Each of the constituent codes are decoded separately using likelihood estimates of the other constituent decoder 406 or 416 as a 'priori' information. The constituent decoder 406, 416 must be of a soft-input/soft-output type, such as the Maximum A Posteriori (MAP) algorithm, the sub-optimal Soft-Output Viterbi Algorithm (SOVA), or variations. After both constituent decoders have processed the data, the process can be repeated.

In practice, the turbo decoders 406, 416 are usually limited to a fixed number of iterations consistent with the implementation complexity and performance objectives of the system.

FIG. 4 is a general block diagram of a turbo decoder. Soft information regarding the information bits 404, parity bits for the first encoder 402, and parity bits of the second encoder 402' are received from the demodulator. First, a first decoder 406 uses received information bits 404 and received parity bits 402 to produce a soft decision 408 on information bits. The soft decision 408 is interleaved by an interleaver 412, the output of which is soft decision 414. Soft decision 414 is fed to a second decoder 416 as a priori information.

The second decoder 416 accepts the soft decision 414 described above and produces an improved soft decision 420 on information bits which are then interleaved by an interleaver 422 and fed to the first decoder 406 as a priori information. The whole process is repeated as many times as desired. Final output 420 is obtained by making hard decisions or the soft decisions out of the first or second decoder.

In accordance with the present invention, a single mother Turbo Code and various puncturing patterns are sought to derive uniformly good codes for various code rates and information block sizes.

A methodology for determining universal constituent codes is developed by first limiting the initial pool of possible universal constituent codes in accordance with trade-off studies between performance and implementation complexity. In accordance with the present invention, performance studies using different state codes have shown that eight-state constituent codes provide a good performance trade-off.

Universal constituent codes are first optimized according to the primary code rate of the targeted application. For example, in the case of CDMA data communications, separate optimizations can be done for the forward and reverse links since the reverse links usually requires lower code rates for higher coding gain.

The following steps, more fully described below, are used to produce Turbo Codes optimized for rate 1/2 and 1/3:

1) select candidate systematic rate 1/2 constituent encoders with transfer function of the form G(D)=[1, n(D)/d(D)], where d(D) is a primitive polynomial and n(D) starts with 1 and ends with $D^3$;

2) determine a Turbo Code rate 1/2 and rate 1/3 test puncturing pattern to apply to output data encoded by two rate 1/2 constituent encoders;

3) form all possible rate 1/2 and 1/3 Turbo Codes by combining each rate 1/2 constituent code pair with the test patterns;

4) evaluate a relative BER performance of all possible rate 1/2 and 1/3 Turbo Codes at a fixed Interleaver length;

5) select from the group of mother pairs, a subgroup of candidate pairs for building optimized Turbo Codes based upon a best overall BER performance;

6) evaluate another relative BER performance of a Turbo Code group comprising the subgroup of candidate pairs punctured with the rate 1/2 and rate 1/3 puncturing patterns at a plurality of other Interleaver depths;

7) select from the Turbo Code group, a universal code pair which has another best overall relative BER for the Interleaver depths; and 8) encode data with a rate 1/2 or rate 1/3 Turbo Code comprising the selected universal code pair, at a first and a second encoder, the encoders similar, and an Interleaver feeding bits into the second encoder, wherein the bits are ordered differently before entering each encoder.

Once generated, best Turbo Codes of lower rates such as 1/4, which are compatible with the rate 1/2 and 1/3 Turbo Codes determined by the above steps, can also be determined.

Rate 1/2 Constituent Codes

The following describes how rate 1/2 constituent codes are determined in one embodiment.

First, a list of candidate eight-state, rate 1/2 constituent code polynomials are determined.

Table 1 lists the determined denominator polynomials d(D) and numerator polynomials n(D) in octal notation. There are twelve constituent code candidates considered for initial screening purposes.

TABLE 1

Candidate 8-State Constituent Encoders of Rate ½

| Denominator Polynomial d(D) (octal notation) | Numerator Polynomial n(D) (octal notation) |
|---|---|
| 11 | 13 |
| 11 | 15 |
| 11 | 17 |
| 13 | 11 |
| 13 | 15 |
| 13 | 17 |
| 15 | 11 |
| 15 | 13 |
| 15 | 17 |
| 17 | 11 |
| 17 | 13 |
| 17 | 15 |

Each of the twelve (12) polynomials is expressed in octal form in Table 1, and has a corresponding binary and polynomial notation. The binary equivalent, for example of octal 13, is binary 1011. Binary 1011 corresponds to a polynomial $$d(D)=D^0(1)+D^1(0)+D^2(1)+d^3(1)=1+D^2+D^3.$$

Next, the candidate Turbo Codes are simulated with an interleaver size of 1000 bits and three decoder iterations. The preliminary screening, which results are shown in FIG. 5 and FIG. 6, evaluates the Bit Error Rate (BER) versus Ebi/No performance of all candidate Turbo Codes of rate 1/2 and rate 1/3 as it is described above. Measurement of Ebi/No is equivalent to a relative SNR.

The results of FIG. 5 and FIG. 6 are used to select six (6) code polynomial pairs. The six (6) candidate universal code pairs, d(D)-n(D), are shown in octal representation on the left hand side of Table 2 below.

Next, a corresponding performance of the eight-state Turbo Codes, using simulated data with the candidate universal codes at each rate and Interleaver depth, is used to construct Table 2. A sample performance study or simulation is shown in FIGS. 7 and 8 showing selected Turbo Codes at an Interleaver depth of 512 bits for rate 1/2 and rate 1/3.

Table 2 below shows the approximate SNR loss for simulated data due to using a non-optimized code at rates 1/2 and 1/3 and Interleaver depths of 512, 1024, 2048, and 3072 bits.

TABLE 2

Approximate SNR Loss due to Use of Non-Optimized Codes

| Candidate "Universal" Code: d(D)-n(D) | Turbo Code Rate & Frame Size (bits) | | | | | | | |
|---|---|---|---|---|---|---|---|---|
| | ½ & 512 | ½ & 1024 | ½ & 2048 | ½ & 3072 | ⅓ & 512 | ⅓ & 1024 | ⅓ & 2048 | ⅓ & 3072 |
| 15–13 | 0.005 dB | 0.00 dB | 0.00 dB | 0.05 dB | 0.10 dB | 0.05 dB | 0.05 dB | 0.10 dB |
| 13–15 | 0.00 dB | 0.00 dB | 0.00 dB | 0.00 dB | 0.05 dB | 0.05 dB | 0.05 dB | 0.05 dB |
| 15–17 | 0.05 dB | 0.05 dB | 0.00 dB | 0.05 dB | 0.05 dB | 0.05 dB | 0.00 dB | 0.10 dB |
| 17–15 | 0.40 dB | 0.50 dB | | | 0.00 dB | 0.00 dB | 0.05 dB | 0.00 dB |
| 17–13 | 0.40 dB | 0.50 dB | | | 0.00 dB | 0.00 dB | 0.00 dB | 0.00 dB |
| 13–17 | 0.05 dB | 0.05 dB | 0.05 dB | 0.00 dB | 0.00 dB | 0.10 dB | 0.00 dB | 0.10 dB |

In a similar simulation using sixteen-state codes, pairs denoted as 31-33 and 31-27 are also shown in sample FIGS. 7 and 8 using four (4) decoder iterations for each sixteen-state code in order to provide similar complexity comparison with the eight-state codes using eight (8) decoder iterations. Eight-state codes with eight iterations out perform sixteen state codes with four iterations significantly.

With separate simulations, the difference in performance amongst the different interleavers using the above six (6) candidate pairs is observed to be within 0.05 dB.

Finally, the results of Table 2 show that the following rate 1/2 constituent code pair provides the best overall performance across the ranges of rates and Interleaver sizes studied:

$$d(D)=1+D^2+D^3; \; n(D)=1+D+D^3,$$

which represents octal 13 and octal 15 respectively.

In each tabulated case, the performance of Codes 13-15 is within 0.05 dB to the best performing code for that rate and Interleaver size.

This constituent code is thus selected as the basis for Turbo Code designs where higher code rates such as 1/2 and 1/3 are dominant.

Rate 1/3 Constituent Code

The following describes how rate 1/3 constituent codes are determined. Similar to the rate 1/2 constituent codes, rate 1/3 constituent code candidates are identified in Table 3 below for building near optimal Turbo Code rates of 1/4 and 1/5. For this case, the constituent code candidates for a Turbo Code must have three (3) polynomials instead of two (2).

TABLE 3

Candidate Constituent Codes for Optimized Lower-Rate Turbo Codes

| CC#1 (Octal 13-15/17) | CC#2 (Octal 15-13/17) | CC#3 (Octal 17-13/15) |
|---|---|---|
| d(D) = 1 + D² + D³ (Octal 13) | d(D) = 1 + D + D³ (Octal 15) | d(D) = 1 + D + D² + D³ (Octal 17) |
| n₁(D) = 1 + D + D³ (Octal 15) | n₁(D) = 1 + D² + D³ (Octal 13) | n₁(D) = 1 + D² D³ (Octal 13) |
| n₂(D) = 1 + D + D² + D³ (Octal 17) | n₂(D) = 1 + D + D² + D³ (Octal 17) | n₂(D) = 1 + D + D³ (Octal 15) |

Optimal Rate 1/4 Turbo Codes

In order to build an overall rate 1/4 Turbo Code, various puncturing schemes must be considered in combination with each constituent codes of Table 3.

The various puncturing schemes of FIG. 9 are first considered. For a rate 1/4 code, a common input information bit or systematic bit, is transmitted by one encoder, along with three (3) of four (4) parity bits produced for that input bit, by the two encoders.

The puncturing patterns of FIG. 9, namely 910, 920, 930 and 940 are selected based upon the previously mentioned design principles, to meet stipulated code rates.

Next, each of the three (3) code triads of Table 3 is combined with the four (4) puncturing patterns 910, 920, 930 and 940, of FIG. 9 to produce twelve (12) possible Turbo Codes to be evaluated with simulated data shown in FIG. 10 through 12 for a fixed Interleaver depth of 512, for example.

Next, the performance of the twelve (12) Turbo Codes above is used to select three (3) best Turbo Code candidates for a more detailed evaluation. Based on the simulation results shown in FIGS. 10 through 12, the three (3) best Turbo Code candidates from the twelve (12) are:

Turbo Code A—Constituent Code No. 1 with puncturing Pattern No. 2;

Turbo Code B—Constituent Code No. 2 with puncturing Pattern No. 1; and

Turbo Code C—Constituent Code No. 3 with puncturing Pattern No. 1. (Puncturing patterns are selected from FIG. 9, Patterns 910, 920, 930 and 940).

One of the Turbo Codes of Codes A through C is next selected for further evaluation using simulated data at various additional Interleaver frame sizes to verify that the puncturing patterns are also good at other Interleaver depths.

To confirm the basic methodology, the performance of a Turbo Code based upon Constituent Code No. 1 (for example) is simulated for frame sizes of 1024, 2048 and 3072 bits. Sample results for BER/FER performance of Code #1 at 1024 bits is shown in FIG. 13 and confirms the basic methodology.

Next, FIG. 14 shows the BER/FER performance of simulated data using the three rate 1/4 Turbo Code Candidates A through C at an Interleaver depth of 512 bits. Consistent results are also achieved at Interleaver sizes 1024, 2048 and 3072 bits.

Next, a rate 1/4 Turbo Code candidate is selected from Candidate Turbo Codes A through C which provides the best overall performance at all Interleaver depths, in the simulation resulting in FIG. 14 and analogous figures, such as those depicted in Appendix A. In the case of the rate 1/4 Turbo Code, optimization based on BER performance gives a different result than optimization based on FER performance. Turbo Code B has the best overall FER performance and Turbo Code C the best overall BER performance, for the simulated data. FIG. 15 shows the performance of Turbo Code B as compared to other puncturing schemes.

Thus, FER optimized Turbo Code B is selected as the basis for the design since FER performance is usually the more important criteria for data services. On the other hand, Turbo Code A can be punctured to give the same universal Turbo Code identified previously as optimal for rate 1/3 (by puncturing all parity bits from the $n_2(D)$ polynomial). Hence, Turbo Code A is the preferred choice for the forward link rate 1/4 codes in order to have a single universal mother code to implement all of the different code rates.

Although current third generation CDMA encoding primarily concerns rate 1/4 channel encoding on the reverse link, rate 1/3 and rate 1/2 channel coding may be required for some of the highest rate data channels. A universal Turbo Code for rate 1/4, rate 1/3 and rate 1/2 can be designed, wherein the underlying constituent code is the same and only the puncturing pattern used is different. The method for generating the higher rate Turbo Codes from the rate 1/3 constituent code follows. Rate 1/3 Turbo Codes Optimized at Rate 1/4 Using the constituent codes derived from the rate 1/4 optimized Turbo Codes above, namely Turbo Code B, the rate 1/3 and rate 1/2 Turbo Code can be designed to be compatible thereto. Thus, Constituent Code No. 2 (from Code B) is used as the basis.

FIG. 16 shows seven (7) basic puncturing patterns that can be used to produce a rate 1/3 Turbo Code and four (4) basic puncturing patterns to produce a rate 1/2 Turbo Code. The seven (7) rate 1/3 patterns, 1602 through 1614 in block diagram 1600, show the consecutive information puncturing bit patterns, 1620, 1626, and the four (4) corresponding row parity bit puncturing patterns 1622, 1624, 1628, and 1630, for the two (2) encoder puncturing block patterns 1616 and 1618.

As before, the pattern "1111" shown in row 1620 always transmits all the information bits from encoder 1. The pattern "0000" of row 1626, always punctures the information bits that enter by encoder No. 2. This is because it is not necessary to transmit the information bit twice. The four (4) rate 1/2 puncturing patterns, 1 through 4, identified in FIG. 16 as element numbers 1640, 1642, 1644, and 1646, follow the same notation.

Next, in FIG. 17 the BER and FER performance of all possible rate 1/3 Turbo Codes simulated with the preferred Constituent Code No. 2 at an Interleaver depth 512 are compared.

Then the two (2) best patterns are selected for further consideration. Next, the performance of these two (2) patterns are compared at further Interleaver depths 1024, 2048 and 3078 bits.

In FIG. 17, for example, showing the rate 1/3 puncturing patterns at 512 bits, Patterns 2 and 5 are selected based upon curves 1710 and 1720, as having the best and next best overall relative FER, respectively.

Pattern 2 is then selected as the best performer over the various Interleaver depths from further simulations analogous to that of FIG. 17 at additional Interleaver sizes for 1024, 2048 and 3072 bits.

Rate 1/2 Turbo Codes Optimized at Rate 1/4

Rate 1/2 Codes can also be optimized at lower rate codes for similar compatibility as described above. FIG. 18 compares the BER and FER simulated performance of all the rate 1/2 Turbo Codes at an Interleaver depth of 512 bits. FIG. 18 is generated using Constituent Code No. 2 and the four (4) puncturing patterns shown in FIG. 16 for a rate 1/2 Turbo Code. Patterns 1 and 4 are determined to be the best based upon simulated curves 1810 and 1820 for FER performance.

As in the rate 1/3 case optimized at rate 1/4, similar simulation curves to FIG. 18 are done for Patterns 1 and 4 for Interleaver depths of 1024, 2048 and 3072 bits. Based upon the resulting performance/curves Pattern 1 is judged to be the best pattern for FER performance.

Preferred Universal Turbo Codes Optimized for Rate 1/2 and 1/3

FIG. 19 shows a block diagram for the constituent encoder optimized in accordance with the previously described method for Turbo Code rates 1/2 and 1/3. FIG. 20 shows the block diagram for the corresponding Turbo Code punctured to rate 1/4.

Information bit stream X(t) 1902 is received at a switch 1922, and is processed in accordance with several modular adders 1904, 1908, 1920, 1910, 1914, 1918, 1919, and several shift registers 1906, 1912 and 1916 which are hard-wired to represent two (2) numerator polynomials and one denominator polynomial.

In FIG. 19, the denominator polynomial d(D), represented in octal 13, is hardwired by the return feedback connection to modular adder 1920 and 1904. Before computing, three shift registers 1906, 1912 and 1916 are first zeroed.

A first numerator polynomial over a denominator polynomial, represented by "1101" is hardwired to return output $Y_0$ (t) by combining: X(t) 1992 with a result of modulator adder 1920 to create a first bit W(t); the modular sum (second bit) of shift register 1906 and W(t) from the modular adder 1908; another zero bit (third bit) indicated by the lack of connection to the register 1912; and the modular sum (fourth bit) of another register 1916 and a result of modular adder 1908 from modular adder 1998. The result is $Y_0(t)=W(t)+S_0(t)+S_2(t)$.

In FIG. 19 a second numerator polynomial over a denominator polynomial, represented by "1111", is hardwired to return output $Y_1(t)$ by combining: X(t) 1902 with a result of adder 1920 to create a first bit W(t); adding contents of a further register 1906 to W(t) with the contents of the modular adder 1910 (second bit); adding contents of the register 1912 a result of adder 1710 with the modular adder 1914 (third bit); and adding contents of the other register 1916 to a result of adder 1914 with modular adder 1919 (fourth bit). The result is $Y_1(t)=W(t)+S_0(t)+S_1(t)+S_2(t)$.

In FIG. 19, the denominator polynomial connections sum the result of the register 1912 with register 1916 at adder 1920 and then adds it to X(t) 1902 at adder 1904. Thus, if modular adder 1904 is the value W(t), register 1906 holds $S_0(t)$, register 1912 holds $S_1(t)$ and register 1916 holds $S_2(t)$, and adder 1904 produces $W(t)=X(t)+S_1(t)+S_2(t)$; $Y_0(t)=W(t)+S_0(t)+S_2(t)$; and $Y_1(t)=W(t)+S_0(t)+S_1(t)+S_2(t)$. Thus, the adding is cumulative.

The result of a modular adder is a "1" if the two bits are different, and a "0" if the two bits are the same. Output $Y_0(t)$ represents the output from numerator Polynomial No. 1 and the denominator polynomial. Output $Y_1(t)$ represents numerator Polynomial No. 2 and denominator polynomial.

Initially, $S_0=S_1=S_2=0$ and the values of the registers 1906, 1912, 1916 are shifted from left to right after each clock cycle increment. Thus, $S_0(t+1)=W(t)$; $S_1(t+1)=S_0(t)$, and $S_2(t+1)=S_1(t)$.

The optimal puncturing matrices, shown in FIG. 20, for example, shows a "1" for transmitted bits and a "0" for punctured bits. Exemplary FIG. 20 shows encoder 2000 with incoming bit X(t) and Interleaver 2002 passing interleaved bits X'(t) to encoder 2006 to produce output bit X'(t) and parity bits $Y_0^1(t)$, and $Y_1^1(t)$. None of the interleaved bits x'(t) are processed in the rate 1/4 encoder 2004, only in the second rate 1/4 encoder 2006. Block 2010 shows the puncturing pattern matrices.

More complicated puncturing patterns can be used to achieve other possible coding rates. For example, it is possible to select optimal puncturing patterns to achieve rate 3/8 and 4/9 for Turbo Codes optimized at rates 1/2 and 1/3; and to achieve rates 2/9 and 3/8 for Turbo Codes optimized at rate 1/4 using the preferred Turbo Codes identified in the invention.

Similar to FIG. 9 the block diagram for an optimal Turbo Code rate 3/8 uses the rate 1/3 mother constituent code of FIG. 20. The encoder for the constituent code of FIG. 20 is shown in FIG. 19. The puncturing pattern of the rate 3/8 Turbo Codes shown in FIG. 21 punctures 1 out of every 6 bits associated with the first numerator polynomial from both encoders to generate a rate 3/8 Turbo Code.

The second pattern is a extension of the first pattern allowing both constituent encoders to have the same rate, namely 6/11. The extension pattern duplicates the same pattern (matrix) for another three (3) bits but moves the location of one transmission bit from one encoder to another, essentially flipping a "1" in one encoder while flipping a "0" in another encoder at the analogous locations.

FIG. 22 shows the performance of these patterns at an Interleaver depth of 512 bits. Based on these and analogous curves at 1024, 2048 and 3072 Interleaver depths, Pattern 2 is chosen to implement the rate 3/8 Turbo Codes.

Figures 21, 23, 27:
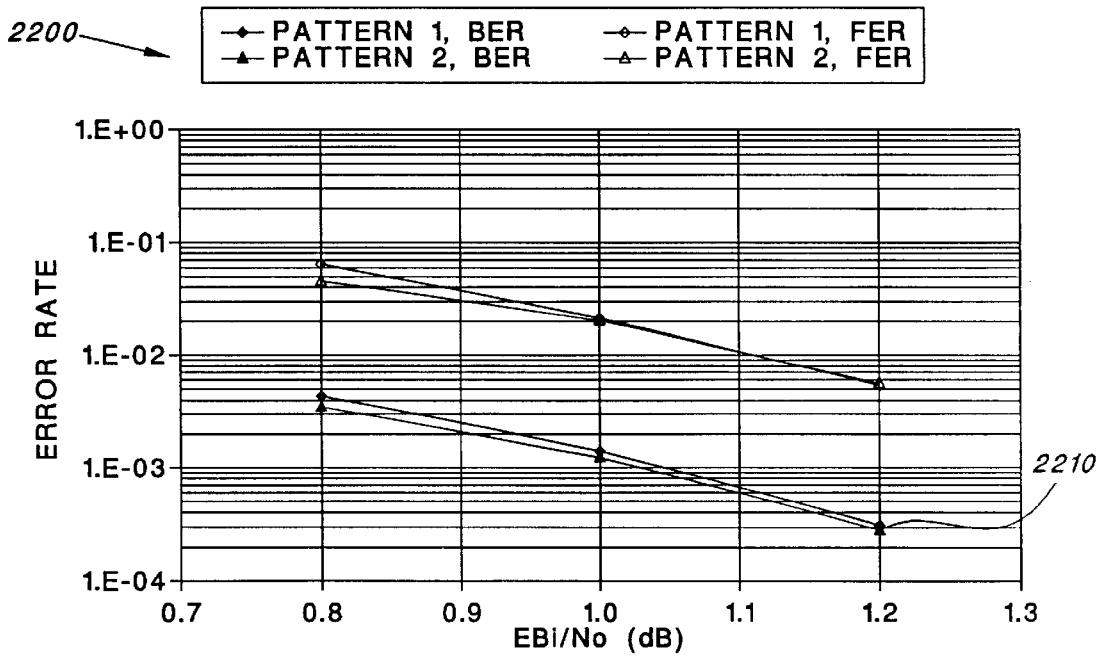
FIG. 21 illustrates puncturing patterns for rate 3/8 Turbo Codes.
FIG. 23 illustrates puncturing patterns for rate 4/9 Turbo Codes.
FIG. 27 illustrates puncturing patterns for rate 2/9 Turbo Codes.

FIG. 23 shows the puncturing patterns selected for rate 4/9 Turbo Codes used with the mother of codes of FIG. 20. Similarly, the second pattern is an extension of the first, which allows both constituent encodes to have the same rate, namely 8/13.

FIG. 24 shows the corresponding performance curves. Pattern 2 is chosen to implement the rate 4/9 Turbo Codes.

Thus, one exemplary Turbo Code design, optimized for Turbo Code rates 1/2 and 1/3, and universal for all Interleaver depths, has the preferred generator polynomials $d(D)=1+D^2+D^3$, $n_1(D)=1+D=D^3$, and $n_2(D)=1+D+D^2+D^3$.

The preferred puncturing patterns for various code rates are:

1) Rate 1/4—alternately puncturing parity bits $n_1$ from one encoder and $n_2$ from the same encoder;
2) Rate 1/3—puncturing parity bits $n_2$ from both encoders;
3) Rate 1/2—puncturing parity bits $n_2$ and alternately puncturing parity bits $n_1$ from both encoders;
4) Rate 3/8—puncturing parity bits $n_2$ and one out of every 6 parity bits $n_1$ from both encoders; and
5) Rate 4/9—puncture parity bits $n_2$ and uniformly 3 out of every 8 parity bits $n_1$ from both encoders.

A simplified version of this code is the universal Turbo Code design consisting of two constituent encoders having generator polynomials $d(D)=1+D^2+D^3$ and $N_1(D)=1+D+D^3$. (The third polynomial $n_2(D)$ is not used, so the corresponding output is not generated and the encoder block diagram is simplified by removing the corresponding connections.) This universal Turbo Code design supports a minimum code rate equal to 1/3 (instead of 1/5). The corresponding preferred set of puncturing patterns are:

1. Rate 1/3—no puncturing
2. Rate 1/2—alternately puncturing parity bits n1 from both encoders;
3. Rate 3/8—puncturing one out of every 6 parity bits $n_1$ from both encoders; and
4. Rate 4/9—puncturing uniformly 3 out of every 8 parity bits n1 from both encoders.

Preferred Universal Turbo Codes Optimized for Code Rate 1/4

The basic block diagram for a preferred constituent encoder is shown in FIG. 25.

FIG. 26 is an encoder block diagram for the preferred rate 1/4 Turbo Code. In this case, the second parity bits are alternately punctured by the two constituent encoders. The preferred puncturing patterns described in earlier section can then be applied to produce rate 1/3 and rate 1/2 Turbo Codes. Other rates can also be supported by identifying further puncturing patterns. This is illustrated by considering rates 2/9 and 3/8.

FIG. 27 shows the puncturing patterns for a 2/9 reverse link code. Three (3) different patterns are compared by performance curves in FIG. 28 and analogous curves, such as those set forth, for example, in Appendix A, showing performance at various frame Interleaver sizes. From a Pattern 2 FER curve 2810 and analogous curves, Pattern No. 2 is chosen as the optimal FER pattern for rate 2/9.

Figure 29:
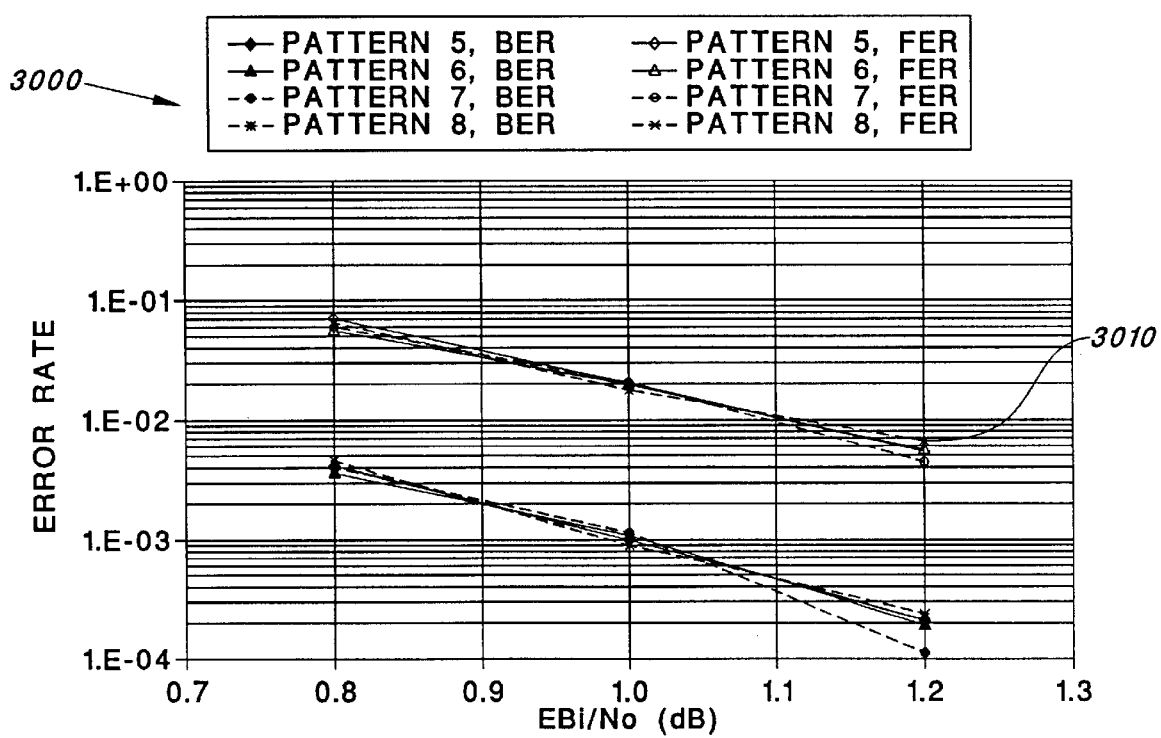
FIG. 29 illustrates initial puncturing patterns for rate 3/8 Turbo Codes.

Next, FIG. 29 illustrates six (6) initial screening puncturing patterns for optimizing a rate 3/8 reverse link codes. The performance of these patterns is simulated at a fixed Interleaver length of 512 bits. Based on the simulation, Pattern 5 and Pattern 6, are chosen as the optimal puncturing patterns for further review.

Two more extension Patterns 7 and 8 of the above Patterns 5 and 6 duplicate the same patterns for another three information bits, but move the location of one of the transmission bits in the parity sequence from one encoder pattern to another. The extension allows both constituent encoders to have the same rate, namely 6/11 at each encoder.

FIG. 30 shows exemplary performance curves of the above four (4) candidate puncturing Patterns 5, 6, 7 and 8 for rate 3/8 Turbo Codes. Based on these results, a Pattern 8 FER curve 3010 and analogous curves demonstrate that Pattern 8 is the optimal puncturing Pattern for rate 3/8 Turbo Codes.

Thus, one preferred Universal Turbo Code design optimized for Rate 1/4 uses two constituent codes having polynomials $d(D)=1+D+D^3$, $n_1=1+D^2+D^3$ and $n^2=1+D+D^2+D^3$.

The below puncturing patterns are associated optimized patterns as previously discussed for Turbo Code rate 1/4 and FER performance for most commonly used Turbo Code rates, where $n_1$ represents output bits associated with a first numerator polynomial, and $n_2$ represents output bits associated with a second numerator polynomial:

1) Rate 1/4—alternately puncture parity bits $n_2$ from both constituent encoders.
2) Rate 1/3—puncture parity bits n, from both constituent encoders;
3) Rate 1/2—puncture parity bits $n_2$ and every other parity bits $n_1$ from both encoders;
4) Rate 2/9—puncture every one out of every four parity bits in $n_1$ from both encoders; and
5) Rate 3/8—puncture parity bits $n_1$ and one out of every six parity bits $n_2$.

These preferred puncturing patterns can also be cyclically shifted without affecting performance. The cyclically shifted patterns are equivalent.

Turbo Coding FEC Schemes for CDMA Data Services

The set of preferred universal Turbo Codes described heretofore in this invention provide a suite of flexible high performance channel codes that are well suited for sophisticated data communication systems requiring a variety of low speed and high speed data services. This suite of preferred universal Turbo Codes allows the crafting of different Turbo encoding schemes to meet the specific requirements of particular data communication systems.

As a first example, either of the following two FEC schemes is well-suited and recommended for a synchronous CDMA data communications network (such as the third generation CDMA 2000 system currently under development):

1) A preferred universal Turbo Code optimized at codes rates 1/2 and 1/3, along with a subset of associated preferred puncturing patterns, on a forward link; and a preferred universal Turbo Code optimized at code rate 1/4, along with a subset of the associated preferred puncturing patterns, on a reverse link; and
2) The preferred universal Turbo Code optimized at code rates 1/2 and 1/3, along with a subset of associated preferred puncturing patterns, on both the forward and reverse links.

As a second example, either of the following FEC schemes is well-suited and recommended for an asynchronous CDMA data communications network (such as the third generation UTRA system currently in development in Europe and Asia):

1) The preferred universal Turbo Code optimized at code rates 1/2 and 1/3, described above, along with a subset of associated puncturing patterns, on both the forward and reverse links;
2) The preferred universal Turbo Code optimized at code rate 1/4, described above, along with a subset of the associated preferred puncturing patterns, on both the forward and reverse links; and
3) The simplified version of the universal Turbo Code, described above, along with a subset of the associated preferred puncturing patterns, on both the forward and reverse links; and The choice of which option to implement depends on the expected dominant code rate, minimum code rate, and implementation complexity constraints as well as other system requirements. Of course, additional puncturing patterns could be designed in accordance with the teachings of this invention to provide other Turbo Coding rates.

Other Variations

The universal Turbo Codes identified for high-speed data services are especially suitable for third generation CDMA cellular mobile radio systems but could be easily applied to other systems as well.

Well known variations such as Frame Oriented Convolutional Turbo Coding (FOCTC) could also be used in conjunction with the preferred universal constituent codes and universal Turbo Codes of this invention. The design methodology for selecting universal constituent codes and universal Turbo Codes can also be applied to alternate Turbo Code structures such as those involving more than two constituent encoders, and those involving serial concatenation instead of or in addition to parallel concatenation.

The exemplary preferred puncturing patterns described herein can be refined or modified in various ways by those skilled in the art. For example, a cyclic shift of a preferred puncturing pattern offers substantially equivalent performance as the preferred puncturing pattern described herein. Furthermore, specific data communication systems may require different and additional puncturing patterns to support rate matching. These puncturing patterns may be designed in accordance with the teachings of the present invention.

Sets of Rate-Compatible Universal Turbo Codes

In accordance with the present invention, it is possible to provide sets of rate-compatible Turbo Codes that are uniformly optimal or nearly optimal over a AWGN channel for various code rates and various Interleaver depths by assuring that any given higher rate Turbo Code of a set transmits the same bit positions as transmitted by any other lower rate Turbo Code of a same set.

In particular, one embodiment includes a set of rate-compatible Turbo Codes at various code rates of 1/5, 1/4, 1/3 and 1/2 and also at various Interleaver depths from 512 to 3072 bits.

Another preferred embodiment provides multiple sets of Turbo Codes optimized under different conditions allowing a system designer to trade off degree of universality (and thus, complexity) with performance and vice a versa. The selection of sets of rate-compatible Turbo Codes is based upon the universal constituent encoder described herein below.

The universal constituent encoder of the present invention provides optimal or nearly optimal performance over a large range of code rates and Interleaver depths. Different optimization criteria such as reverse link or forward link dominance and degree of universality, result in different sets of rate-compatible Turbo Codes.

The sets of rate-compatible codes are especially well suited for use in hybrid ARQ schemes applied in satellite broadcast and telephony.

Several preferred embodiments comprise different sets of rate-compatible codes based upon different universal constituent codes and different rate puncturing patterns optimized according to different design criteria.

Consistent with general methodologies of the present invention, four (4) different preferred sets of rate-compatible Turbo Codes are described herein. The first two (2) sets are optimized for high-rate Turbo Codes, wherein higher-rates dominate. The second two (2) sets are optimized for lower-rate codes, where lower-rates dominate. The sets are referred to herein as Sets A–D.

The first preferred set is derived from a best universal constituent code of rate 1/2.

The second set is derived from another best constituent code of rate 1/3 which is also compatible with the universal constituent code of rate 1/2.

The first set, "Set A" has two generator polynomials while the second set, "Set B" has three generator polynomials of which two are in common with "Set A". Thus, "Set B" is optimally compatible with "Set A", reducing the amount of design changes for encoding and decoding. As before, the third polynomial is necessary for the additional encoder parity bits of a rate 1/3 or lower Turbo Code.

The second set, "Set B" includes "Set A" and also extends the family of Turbo Codes to rate 1/5 and higher.

A third and fourth preferred set of rate-compatible Turbo Codes are optimized for lower-rates, in particular for rate 1/4. "Set C" and "Set D", respectively, also use three generator polynomials which are the same as those in "Set B", but in a different order.

Rate-Compatible Set Derived from Universal Constituent Codes of Rate 1/2: Set A (Rates 1/3, 1/2)

From Table 2, it is determined that the rate 1/2 constituent code providing the best overall performance is octal pair 13-15. Thus, this constituent code pair is used as the mother constituent code pair for Set A.

Rate-compatible Set A comprises generator polynomials corresponding to octal pairs 13-15, wherein a denominator polynomial is $1+D^2+D^3$ (octal 13) and a numerator polynomial is $1+D+D^3$ (octal 15).

The puncturing patterns are designed such that all bits transmitted by a rate of 1/2 code (or higher rate) of the set are also transmitted by a rate 1/3 code, or lower rate code of the set.

Exemplary preferred patterns as demonstrated by simulations and design principles are:

1) For rate 1/3 there is no puncturing; and
2) For rate 1/2, the parity bits are alternately punctured between encoders. (Note that there is no second numerator polynomial encoding in this case.)

FIG. 31 shows a block diagram for the Set A constituent encoder. In FIG. 31, modular adders 3104, 3108 (connected to shift register 3106), and 3116 (connected to shift register 3114) comprise the encoding apparatus for, a numerator polynomial representing octal 15 or binary 1101.

Modular adders 3104, 3108, 3112 and 3116 add the contents of shift registers 3106, 3110 and 3114 and X(t) in an analogous fashion as FIG. 19.

Simulated performances of the rate 1/2 Turbo Code and the rate 1/3 Turbo Code show that the eight-state convolutional codes designed herein (with 8 decoder iterations) have a performance gain (BER) of about 1.6 dB at rate 1/2 and about 2.0 dB at rate 1/3 with respect to the best 256-state convolutional codes known, according to simulation data produced by the Applicant.

Thus, the Turbo Codes of Set A compare favorably in performance to the best known 256-state convolutional codes, when simulated for the critical performance parameters.

Rate-Compatible Set Derived from Universal Constituent Code of Rate 1/3: Set B (Rates 1/2, 1/3, 1/4, 1/5)

As in the case of determining universal constituent codes of rate 1/3 an additional output numerator polynomial is required for the rate-compatible generator polynomials of "Set B" derived from the best constituent code of rate 1/3.

Therefore, a second best individual rate 1/2 constituent code is chosen from Table 2. As before, this method results in two (2) octal pairs with an overlap. Both octal pairs, octal 13-15 and octal 13-17 provide uniformly excellent performance. Combining the two (2) pairs together provides three (3) generator polynomials, comprising the triad octal 13-15/17. The denominator polynomial is $1+D^2+D^3$ (octal 13); the first numerator polynomial is $1+D^2+D^3$ (octal 15); and the second numerator polynomial is $1+D+D^2+D^3$ (octal 17). The preferred design for Set B comprises these generator polynomials above for all Interleaver depths and for Turbo Code rates 1/2, 1/3, 1/4 and 1/5.

In Set B the rate 1/3 and rate 1/2 Turbo Codes built from the rate 1/3 constituent encoder are the same 1/3 and 1/2 Turbo Codes in Set A built from the universal rate 1/2 constituent encoder, preserving the compatibility between Set A and Set B.

The puncturing patterns are designed such that all bits transmitted at any higher rate Turbo Code of Set B are also transmitted at any lower code rate of Set B.

Exemplary preferred patterns, as demonstrated by simulations and design principles, are:

1) Rate 1/5—no puncturing;
2) Rate 1/4—alternately puncture the second numerator parity bits, $n_2$;
3) Rate 1/3—always puncture the second numerator parity bits, $n_2$; and
4) Rate 1/2—always puncture the second numerator parity bits, $n_2$ and alternately puncture the first numerator parity bits, $n_1$.

For the rate 1/4 pattern the weaker of the two (2) output arms of the constituent encoders are alternately punctured.

For the rate 1/3 pattern, the weaker of the two (2) constituent encoder outputs is always punctured.

For rate 1/2 the weaker of the two (2) constituent encoder outputs is always punctured for both encoders and the stronger output is alternately punctured.

Rate-Compatible Set Optimized for Lower Turbo Code Rates

When higher code rates are the dominant modes Turbo Code Set B is the preferred design choice when strict rate-compatibility is required in all code rates.

Turbo Code Set C and Set D, both optimized at the lower Turbo Code rates, are useful when rate-compatibility between lower rate and higher rate Turbo Codes is not necessary.

The optimal Turbo Codes for rates 1/4 and 1/5 are selected based upon the candidate constituent codes listed in Table 3 which are selected based upon the results of Table 2 as previously described above.

Constituent Code No. 1 of Table 3, or octal 13-15/17, is the basis for code Set A. However, disbanding the requirement that the rate 1/4 puncturing pattern be rate-compatible with that of the rate 1/2 or 1/3 codes, in the event that lower rates are not used with higher rates, each three (3) mother Turbo Code triad of Table 3 is considered with each of four (4) different puncturing patterns to obtain a newly optimized 1/4 Turbo Code.

As described before, Turbo Codes A, B, and C are found optimal from respective performance curves 1010, 1110 and 1210 of FIGS. 10, 11 and 12 respectively.

As before, these puncturing patterns are also verified at other Interleaver depths by simulating the performance of the Turbo Codes based on mother code triad No. 1 for additional other Interleaver frame sizes of 1024 2048 and 3072. FIG. 13 shows a sample result of the simulation and confirms the basic methodology at 1024 bits.

Next, FIG. 14 shows a sample corresponding performance of the triads matched with the selected puncturing patterns at 512 bits. From FIG. 14 and analogous results for other Interleaver sizes, the best overall BER performance at all simulated Interleaver depths are used as a final design criterion to determine the optimal candidate.

Rate-Compatible Set Derived from Rate 1/4 Turbo Code: Set C (Rates 1/5, 1/4, 1/3)

Turbo Code Set C implements Code No. 3 and Pattern No. 1 (Turbo Code C) from FIG. 9 in accordance with performance curve 1310 of FIG. 14 and analogous curves for other Interleaver sizes.

Turbo Code Set C comprises a generator polynomial from Table 3 including denominator polynomial $1+D+D^2+D^3$, first numerator polynomial, $n_1$, $1+D^2+D^3$, and second numerator polynomial $n_2$, $1+D+D^2$. The optimal puncturing patterns from the simulation, as previously described and consistent with the methodology, are:

1) For rate 1/5—no puncturing;
2) For rate 1/4—alternately puncturing the second numerator polynomial; and
3) For rate 1/3—always puncturing the second numerator polynomial.

Rate-Compatible Set Derived from Rate 1/4 Turbo Code: Set D (Rates 1/5, 1/4)

Turbo Code Set D comprises a single constituent code for all Interleaver depths and Turbo Code rates 1/4 and 1/5.

Turbo Code Set D implements Code No. 1 with Pattern No. 2 (Turbo Code A) from FIG. 9 in accordance with performance curve 1420 of FIG. 14 and analogous curves at other Interleaver sizes.

The set comprises generator polynomials including a denominator polynomial d, $1+D+D^3$, a first numerator polynomial, $n_1$, $1+D^2+D^2$ and second numerator polynomial, $n_2$, $1+D+D^2+D^3$.

The optimal puncturing patterns from the simulation previously described and consistent with the methodology is:

1) For rate 1/5—no puncturing; and
2) For rate 1/4—alternately puncture output 1/2.

Performance of the rate 1/4 FER optimized Turbo Code at selected Interleaver depths of 512 through 3072 bits are compared against convolutional codes in sample FIG. 32 and analogous studies.

More complicated puncturing patterns may be used in convolutional coding to achieve any code rate greater than or equal to that of the base Turbo Code in each rate-compatible Set.

For example, rates higher than 1/2 or intermediate rates such as 5/12 can be achieved. With the appropriate choice of puncturing patterns this can often be done in a rate-compatible manner without sacrificing error correction performance.

Applications of Rate-Compatible Turbo Codes

An exemplary application of the rate-compatible turbo codes described herein is for rate matching in which the code rate is selected to match the payload of an available physical channel. In rate matching schemes, the data services use the same basic channel encoding but may not use the same physical channel, especially if the quality of service specifications are different for the different data services.

In accordance with the present invention, this is accomodated by selecting different puncturing patterns to produce the code rate compatible with the physical channel. If the puncturing patterns are rate-compatible, the selection of code rate does not have to be completed by single decision unit at a single point in time. Instead, the decision can be distributed in time as well as across decisioning units. The turbo encoder first produces the coded output sequence corresponding to the lowest code rate to be supported by the system. For example, all the possible parity bits might be output initially. Subsequently, an initial puncturing might be performed by one puncturing unit in response to say quality-of-service (QoS) considerations for the given data service. In this scenario, the data service may permit a range of quality-of-service in which, for example, the highest quality within that range does not require the lowest possible code rate available in the system but some intermediate code rate, and the lowest quality within that range can allow an even higher code rate. The first puncturing unit removes coded bits in accordance with the puncturing pattern corresponding to the lowest rate in order to provide the highest quality within the data service's QoS range. The non-punctured coded bits are output to the rest of the system for further processing. In the subsequent processing, a decision might be made to adjust the code rate higher for that message based on dynamic traffic management considerations. For example, a physical channel with smaller payload might be substituted, on a temporary as-needed basis, for the physical channel nominally associated with that data service in order to accomodate messages from a higher priority data service. The higher code rate is achieved by performing a second puncturing in accordance with the puncturing pattern associated with the new code rate. Since the puncturing patterns are rate-compatible, it is not necessary to regenerate coded bits deleted by the first puncturing unit; the second puncturing unit simply deletes those bits specified by the higher rate puncturing pattern that have not already been deleted by the first puncturing unit.

A second exemplary application of the rate-compatible turbo codes described herein is for incremental redundancy schemes such as error control based on ARQ protocols. In these schemes, the turbo encoder first produces coded output corresponding to the highest code rate available in the system. When the coded output is transmitted across the communication channel, the receiver may or may not be able to successfully decode the message. If the message is not successfully decoded, the receiver typically sends a negative acknowledgement (NAK) back to the transmitter to request further transmissions to aide the decoding of that packet. With rate-compatible channel encoding, the extra encoded bits produced by one of the lower-rate compatible encodings for that packet can be sent to augment the information available to the decoder at the receiver. The decoder uses that new information along with the original information received for that packet to perform the decoding. The effect is as if the packet had been originally encoded with the lower rate code. This process can be repeated until the packet is successfully decoded. By only sending the excess coded bits each re-transmission, the traffic loading required for re-transmission is significantly lowered.

While the invention herein disclosed has been described by means of specific embodiments and applications thereof numerous modifications in variations could be made thereto by a skilled artisan and without departing from the scope of the invention set forth in the claims.

What is claimed is:

1. A method of processing data in data services with a set of rate-compatible Turbo Codes optimized at high code rates and derived from a universal constituent code, the Turbo Codes having compatible puncturing patterns, the method comprising the steps of:

encoding a signal at a first and second encoder using a rate 1/2 constituent code that is universal with higher and lower code rates and provides the lowest signal-to-noise ratio loss for the different Turbo code rates and the different frame sizes, the first encoder and the second encoder each producing a respective plurality of parity bits for a data bit;

puncturing the respective plurality of parity bits at each encoder with a higher rate puncturing pattern that provides the lowest signal-to-noise ratio loss for the different Turbo code rates and the different frame sizes; and puncturing the respective plurality of parity bits at each encoder with a lower rate puncturing pattern that provides the lowest signal-to-noise ratio loss for the different Turbo code rates and the different frame sizes.

2. The method of claim 1 wherein the best rate 1/2 constituent code represents a concatenation of polynomial $1+D^2+D^3$ (octal 13) and polynomial $1+D+D^3$ (octal 15), D a data bit.

3. The method of claim 2 wherein one of the rate-compatible Turbo Codes in the set comprises a rate 1/2 Turbo Code and further wherein one of the puncturings comprises alternately puncturing parity bits between the first and the second encoder.

4. The method of claim 2 wherein one of the rate-compatible Turbo Codes in the set comprises a rate 1/3 Turbo Code and further wherein one of the puncturings comprises transmitting all the parity bits at the first and second encoder.

5. A method of processing data in data services using a set of rate-compatible Turbo Codes derived from an optimal universal rate 1/3 constituent code, the Turbo Codes having similar constituent codes and compatible puncturing patterns, the method comprising:

encoding a signal with a rate 1/3 constituent code at a first and a second encoder that provides the lowest signal-to-noise ratio loss for the different Turbo code rates and the different frame sizes, each encoder producing a respective plurality of parity bits for each data bit;

puncturing the plurality of parity bits with the a higher rate puncturing pattern that provides the lowest signal-to-noise ratio loss for the different Turbo code rates and the different frame sizes; and puncturing the plurality of parity bits with a lower rate puncturing pattern that provides the lowest signal-to-noise ratio loss for the different Turbo code rates and the different frame sizes.

6. The method of claim 5 wherein the best rate 1/3 constituent code represents a concatenation of polynomial $1+D^2+D^3$, (octal 13), polynomial $1+D+D^3$ (Octal 15), and polynomial $1+D+D^2+D^3$ (octal 17), D a data bit.

7. The method of claim 5 wherein the set of Turbo Codes comprises a rate 1/5 Turbo Code wherein at least one of the steps of puncturings comprises transmitting all the parity bits at the first and the second encoders.

8. The method of claim 5 wherein the set of Turbo Codes comprises a rate 1/4 Turbo Code wherein at least one of the puncturings comprises:

alternately puncturing a select group of the plurality of parity bits between the first and the second encoder.

9. The method of claim 5 wherein the set of Turbo Codes comprises a rate 1/3 Turbo Code wherein at least one of the puncturings comprises:

puncturing a select group of the plurality of parity bits at the first and the second encoder.

10. The method of claim 5 wherein the set of Turbo Codes comprises a rate 1/2 Turbo Code and further wherein at least one of the puncturings comprises:

puncturing at the encoders a select group of the plurality of parity bits and alternately puncturing at the encoders another select group of the plurality of parity bits.

11. A method of rate-compatible Turbo encoding using a set of rate-compatible Turbo Codes, the set optimized for code rate 1/4, and comprising Turbo Codes with differing code rates and rate-compatible puncturing patterns, the method comprising the steps of:

encoding a signal at a first and second encoder using a rate 1/4 constituent code universal with higher and lower code rates that provides the lowest signal-to-noise ratio loss for the different Turbo code rates and the different frame sizes, the first encoder and the second encoder each producing a respective plurality of parity bits for a data bit;

puncturing the respective plurality of parity bits at each encoder with a higher rate puncturing pattern that provides the lowest signal-to-noise ratio loss for the different Turbo code rates and the different frame sizes; and puncturing the respective plurality of parity bits at each encoder with a lower rate puncturing pattern that provides the lowest signal-to-noise ratio loss for the different Turbo code rates and the different frame sizes.

12. The method of claim 11 wherein the set of rate-compatible Turbo Codes represent a concatenation of polynomials $1+D+D^3$, $1+D^2+D^3$, and $1+D+D^2+D^3$, D a data bit, and wherein an associated rate-compatible puncturing pattern is selected from a group of patterns including:

transmitting all data;

alternately puncturing parity bits associated with polynomial $1+D+D^3$ and puncturing parity bits associated with polynomial $1+D+D^3$ for each encoder.

13. The method of claim 11 wherein the set of rate-compatible Turbo Codes comprise two or more Turbo Codes of differing rates selected from a group of rates including 1/5 and 1/4, the Turbo Codes representing a concatenation of polynomials $1+D+D^3$, $1+D^2+D^3$, and $1+D+D^2+D^3$, D a data bit, and wherein an associated rate-compatible puncturing pattern is selected from the group of patterns including:

transmitting all data; and alternately puncturing parity bits associated with polynomial $1+D+D^2+D^3$.

14. An encoding system using a set of rate-compatible Turbo Codes derived from a universal rate 1/2 constituent code that provides the lowest signal-to-noise ratio loss for the different Turbo code rates and the different frame sizes, the set having compatible puncturing patterns, the system comprising:

a first and second encoder, each encoder comprising:
a plurality of shift registers;
a plurality of adders each adder coupled to a selected portion of the shift registers in a configuration corresponding to the universal rate 1/2 constituent code that provides the lowest signal-to-noise ratio loss for the different Turbo code rates and the different frame sizes; and a puncturer configured with the first and second encoder to puncture a plurality of data outputs from each of the first and second encoder, the puncturing determined by a desired Turbo Code rate in accordance with the set of the compatible puncturing patterns.

15. An encoding system using a set of rate-compatible Turbo Codes derived from a universal rate 1/3 constituent code that provides the lowest signal-to-noise ratio loss for the different Turbo code rates and the different frame sizes, the rate compatible Turbo Codes having similar constituent codes and compatible puncturing patterns, the system comprising:
a first and second encoder, each encoder comprising:
a plurality of shift registers;
a plurality of adders, each of the adders coupled to a selected portion of the shift registers in a configuration corresponding to the rate 1/3 constituent code; and
a puncturer configured with the first and second encoder such to puncture a plurality of data outputs from the first and second encoder, the puncturing determined by a Turbo Code rate in accordance with the set of the compatible puncturing patterns that provides the lowest signal-to-noise ratio loss for the different Turbo code rates and the different frame sizes.

16. An encoding system using a set of rate-compatible Turbo Codes comprising Turbo Codes having a universal constituent code and rate-compatible puncturing patterns for different code rates, the system comprising:
a first and second encoder, each encoder comprising:
a plurality of shift registers;
a plurality of adders each adder coupled to a selected portion of the plurality of shift registers in a configuration corresponding to the universal constituent code; and
a puncturer configured with the first and second encoder for puncturing a plurality of data outputs from the first and second encoder, the puncturing determined by a Turbo Code rate in accordance with the set of compatible puncturing patterns that provides the lowest signal-to-noise ratio loss for the different Turbo code rates and the different frame sizes.

17. A method of determining a set of rate-compatible Turbo Codes, optimized at high code rates the set derived from a universal constituent code of rate 1/2 compatible with higher rate codes that provides the lowest signal-to-noise ratio loss for the different Turbo code rates and the different frame sizes, the Turbo Codes having compatible puncturing patterns, the method comprising the steps of:
selecting a group of candidate mother constituent code pairs comprising primitive, irreducible polynomials based upon code pair screening and diversity, the code pair screening comprising simulating relative Bit Error Rate (BER) performance of rate 1/2 and 1/3 Turbo Codes at a fixed Interleaver length;
measuring a relative Signal-to-Noise ratio loss of a signal after a plurality of encodings for each candidate pair at both a plurality of different Interleaver depths and two different Turbo Code rates, wherein each encoding has a different combination of candidate pair, Interleaver depth, and rate;
selecting a candidate pair based upon a relative Signal-to-Noise loss from the measuring that provides the lowest signal-to-noise ratio loss for the different Turbo code rates and the different frame sizes; and
selecting at least one lower rate and one higher rate puncturing pattern for the best candidate pair, for each of the two or more rate-compatible Turbo Codes of the set, wherein the at least one higher rate pattern selects transmittal of any parity bits selected for transmittal by the at least one lower rate pattern of the set.

18. A system for processing data in data services with a set of rate-compatible Turbo Codes optimized at high code rates and derived from a universal constituent code, the Turbo Codes having compatible puncturing patterns, the system comprising:
an encoder, adapted to encode a signal at a first and second encoder using a rate 1/2 constituent code that is universal with higher and lower code rates and provides the lowest signal-to-noise ratio loss for the different Turbo code rates and the different frame sizes, the first encoder and the second encoder each producing a respective plurality of parity bits for a data bit;
a first puncturer, adapted to puncture the respective plurality of parity bits at each encoder with a higher rate puncturing pattern that provides the lowest signal-to-noise ratio loss for the different Turbo code rates and the different frame sizes; and
a second puncturer, adapted to puncture the respective plurality of parity bits at each encoder with a lower rate puncturing pattern that provides the lowest signal-to-noise ratio loss for the different Turbo code rates and the different frame sizes.

19. The system of claim 18 wherein the best rate 1/2 constituent code represents a concatenation of polynomial $1+D^2+D^3$ (octal 13) and polynomial $1+D+D^3$ (octal 15), D a data bit.

20. The system of claim 19 wherein one of the rate-compatible Turbo Codes in the set comprises a rate 1/2 Turbo Code and further wherein one of the puncturings comprises alternately puncturing parity bits between the first and the second encoder.

21. The system of claim 19 wherein one of the rate-compatible Turbo Codes in the set comprises a rate 1/3 Turbo Code and further wherein one of the puncturings comprises transmitting all the parity bits at the first and second encoder.

22. A system of processing data in data services using a set of rate-compatible Turbo Codes derived from an optimal universal rate 1/3 constituent code, the Turbo Codes having similar constituent codes and compatible puncturing patterns, the system comprising:
an encoder, adapted to encode a signal with a rate 1/3 constituent code at a first and a second encoder that provides the lowest signal-to-noise ratio loss for the different Turbo code rates and the different frame sizes, each encoder producing a respective plurality of parity bits for each data bit;
a first puncture, adapted to puncture plurality of parity bits with the a higher rate puncturing pattern that provides the lowest signal-to-noise ratio loss for the different Turbo code rates and the different frame sizes; and
a second puncture, adapted to puncture the plurality of parity bits with a lower rate puncturing pattern that provides the lowest signal-to-noise ratio loss for the different Turbo code rates and the different frame sizes.

23. The system of claim 22 wherein the best rate 1/3 constituent code represents a concatenation of polynomial $1+D^2+D^3$, (octal 13), polynomial $1+D+D^3$ (octal 15), and polynomial $1+1+D+D^2+D^3$ (octal 17), D a data bit.

24. The system of claim 22 wherein the set of Turbo Codes comprises a rate 1/5 Turbo Code wherein at least one of the steps of puncturings comprises transmitting all the parity bits at the first and the second encoders.

25. The system of claim 22 wherein the set of Turbo Codes comprises a rate 1/4 Turbo Codes wherein a least one of the puncturing comprises:

alternately puncturing a select group of the plurality of parity bits between the first and the second encoder.

26. The system of claim 22 wherein the set of Turbo Codes comprises a rate 1/3 Turbo Code wherein at least one of the puncturings comprises:

puncturing a select group of the plurality of parity bits at the first and the second encoder.

27. The system of claim 22 wherein the set of Turbo Codes comprises a rate 1/2 Turbo Code and further wherein at least one of the puncturings comprises: puncturing at the encoders a select group of the plurality of parity bits and alternately puncturing at the encoders another select group of the plurality of parity bits.

28. A system for rate-compatible Turbo encoding using a set of rate-compatible Turbo Codes, the set optimized for code rate 1/4, and comprising Turbo Codes with differing code rates and rate-compatible puncturing patterns, the system comprising:

an encoder, adapted to encode a signal at a first and second encoder using a rate 1/4 constituent code universal with higher and lower code rates that provides the lowest signal-to-noise ratio loss for the different Turbo code rates and the different frame sizes, the first encoder and the second encoder each producing a respective plurality of parity bits for a data bit;

a first puncturer, adapted to puncture the respective plurality of parity bits at each encoder with a higher rate puncturing pattern that provides the lowest signal-to-noise ratio loss for the different Turbo code rates and the different frame sizes; and a second puncturer, adapted to puncture the respective plurality of parity bits at each encoder with a lower rate puncturing pattern that provides the lowest signal-to-noise ratio loss for the different Turbo code rates and the different frame sizes.

29. The system of claim 28 wherein the set of rate-compatible Turbo Codes represent a concatenation of polynomials $1+D+D^3$, $1+D^2+D^3$, and $1+D+D^2+D^3$, D a data bit, and wherein an associated rate-compatible puncturing pattern is selected from a group of patterns including:

transmitting all data;

alternately puncturing parity bits associated with polynomial $1+D+D^3$ and puncturing parity bits associated with polynomial $1+D+D^3$ for each encoder.

30. The system of claim 28 wherein the set of rate-compatible Turbo Codes comprise two or more Turbo Codes of differing rates selected from a group of rates including 1/5 and 1/4, the Turbo Codes representing a concatenation of polynomials $1+D+D^3$, $1+D^2+D^3$, and $1+D+D^2+D^3$, D a data bit, and wherein an associated rate-compatible puncturing pattern is selected from the group of patterns including:

transmitting all data; and alternately puncturing parity bits associated with polynomial $1+D+D^2+D^3$.

31. A system for determining a set of rate-compatible Turbo Codes, optimized at high code rates the set derived from a universal constituent code of rate 1/2 compatible with higher rate codes that provides the lowest signal-to-noise ratio loss for the different Turbo code rates and the different frame sizes, the Turbo Codes having compatible puncturing patterns, the system comprising:

a first selector, adapted to select a group of candidate mother constituent code pairs comprising primitive, irreducible polynomials based upon code pair screening and diversity, the code pair screening comprising simulating relative Bit Error Rate (BER) performance of rate 1/2 and 1/3 Turbo Codes at a fixed Interleaver length;

a signal measurer, adapted to measure a relative Signal-to-Noise ratio loss of a signal after a plurality of encodings for each candidate pair at both a plurality of different Interleaver depths and two different Turbo Code rates, wherein each encoding has a different combination of candidate pair, Interleaver depth, and rate;

a second selector, adapted to select a candidate pair based upon a relative Signal-to-Noise loss from the measuring that provides the lowest signal-to-noise ratio loss for the different Turbo code rates and the different frame sizes; and a third selector, adapted to select at least one lower rate and one higher rate puncturing pattern for the best candidate pair, for each of the two or more rate-compatible Turbo Codes of the set, wherein the at least one higher rate pattern selects transmittal of any parity bits selected for transmittal by the at least one lower rate pattern of the set.

* * * * *